US012302635B2

(12) United States Patent
Cho et al.

(10) Patent No.: US 12,302,635 B2
(45) Date of Patent: May 13, 2025

(54) SEMICONDUCTOR DEVICE

(71) Applicant: Samsung Electronics Co., Ltd., Suwon-si (KR)

(72) Inventors: Keun Hwi Cho, Seoul (KR); Sangdeok Kwon, Seoul (KR); Dae Sin Kim, Suwon-si (KR); Dongwon Kim, Seongnam-si (KR); Yonghee Park, Hwaseong-si (KR); Hagju Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 45 days.

(21) Appl. No.: 18/486,331

(22) Filed: Oct. 13, 2023

(65) Prior Publication Data

US 2024/0038763 A1   Feb. 1, 2024

Related U.S. Application Data

(63) Continuation of application No. 17/369,236, filed on Jul. 7, 2021, now Pat. No. 11,824,059.

(30) Foreign Application Priority Data

Nov. 13, 2020   (KR) .................. 10-2020-0151739

(51) Int. Cl.
*H10D 84/90* (2025.01)
*H10D 84/01* (2025.01)
(Continued)

(52) U.S. Cl.
CPC ....... *H10D 84/907* (2025.01); *H10D 84/0179* (2025.01); *H10D 84/0186* (2025.01);
(Continued)

(58) Field of Classification Search
CPC ............ H10D 84/907; H10D 84/0179; H10D 84/0186; H10D 84/0193; H10D 84/038;
(Continued)

(56) References Cited

U.S. PATENT DOCUMENTS 7,372,091 B2   5/2008   Leslie
8,443,306 B1   5/2013   Dhong et al.
(Continued)

OTHER PUBLICATIONS

Vincent S. Chang et al., 'Enabling Multiple-Vt Device Scaling for CMOS Technology beyond 7nm Node' *IEEE*, 2020.

*Primary Examiner* — Karen Kusumakar
*Assistant Examiner* — Adam S Bowen
(74) *Attorney, Agent, or Firm* — HARNESS, DICKEY & PIERCE, P.L.C.

(57) ABSTRACT

A semiconductor device includes first and second active patterns respectively on the first and second active regions of a substrate, a gate electrode on the first and second channel patterns, active contacts electrically connected to at least one of the first and second source/drain patterns, a gate contact electrically connected to the gate electrode, a first metal layer on the active and gate contacts and including a first and second power line, and first and second gate cutting patterns below the first and second power lines. The first active pattern may include first channel pattern between a pair of first source/drain patterns. The second active pattern may include a second channel pattern between a pair of second source/drain patterns. The first and second gate cutting patterns may cover the outermost side surfaces of the first and second channel patterns, respectively.

20 Claims, 43 Drawing Sheets

(51) Int. Cl.
  *H10D 84/03* (2025.01)
  *H10D 84/85* (2025.01)
  *H10D 89/10* (2025.01)

(52) U.S. Cl.
  CPC ....... *H10D 84/0193* (2025.01); *H10D 84/038* (2025.01); *H10D 84/853* (2025.01); *H10D 89/10* (2025.01); H10D 84/929 (2025.01); H10D 84/951 (2025.01); H10D 84/961 (2025.01); H10D 84/981 (2025.01); H10D 84/985 (2025.01)

(58) Field of Classification Search
  CPC .... H10D 84/853; H10D 89/10; H10D 84/929; H10D 84/951; H10D 84/961; H10D 84/981; H10D 84/985
  See application file for complete search history.

(56) References Cited

U.S. PATENT DOCUMENTS

| | | |
|---|---|---|
| 9,508,817 B2 | 11/2016 | Yen et al. |
| 10,505,048 B1 | 12/2019 | Xu et al. |
| 10,553,577 B2 | 2/2020 | Tung |
| 10,629,730 B2 | 4/2020 | Reznicek et al. |
| 10,680,084 B2 | 6/2020 | Yu et al. |
| 2017/0018620 A1 | 1/2017 | Liu et al. |
| 2018/0158811 A1 | 6/2018 | Subhash et al. |
| 2019/0189804 A1 | 6/2019 | You et al. |
| 2019/0268000 A1* | 8/2019 | Song ................ H01L 23/528 |
| 2020/0066725 A1 | 2/2020 | Bhuwalka et al. |
| 2020/0144384 A1 | 5/2020 | Sagong et al. |

* cited by examiner

SEMICONDUCTOR DEVICE

CROSS-REFERENCE TO RELATED APPLICATIONS

This U.S. non-provisional patent application is a continuation of U.S. application Ser. No. 17/369,236, filed Jul. 7, 2021, and claims priority under 35 U.S.C. § 119 to Korean Patent Application No. 10-2020-0151739, filed on Nov. 13, 2020, in the Korean Intellectual Property Office, the entire contents of each of which are hereby incorporated by reference.

BACKGROUND

The present disclosure relates to a semiconductor device, and in particular, to a semiconductor device including a field effect transistor and/or a method of fabricating the same.

Due to their small-sized, multifunctional, and/or low-cost characteristics, semiconductor devices are being esteemed as important elements in the electronic industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of inventive concepts provides a semiconductor device having an increased integration density and improved electric characteristics, and/or a method of fabricating the same.

According to an embodiment of inventive concepts, a semiconductor device may include a substrate including a first active region and a second active region; a first active pattern on the first active region, the first active pattern including a pair of first source/drain patterns and a first channel pattern therebetween; a second active pattern on the second active region, the second active pattern including a pair of second source/drain patterns and a second channel pattern therebetween; a gate electrode on the first channel pattern and the second channel pattern; an active contact electrically connected to at least one of the first source/drain patterns and the second source/drain patterns; a gate contact electrically connected to the gate electrode; a first metal layer on the active contact and the gate contact, the first metal layer including a first power line and a second power line; and a first gate cutting pattern and a second gate cutting pattern below the first power line and the second power lines, respectively. The first gate cutting pattern may cover a first outermost side surface of the first channel pattern, and the second gate cutting pattern may cover a second outermost side surface of the second channel pattern.

According to an embodiment of inventive concepts, a semiconductor device may include a substrate including a first logic cell and a second logic cell, which are adjacent to each other in a first direction; a first active pattern on the first logic cell, the first active pattern including a pair of first source/drain patterns and a first channel pattern therebetween; a second active pattern on the second logic cell, the second active pattern including a pair of second source/drain patterns and a second channel pattern therebetween; a first gate electrode on the first channel pattern, a second gate electrode on the second channel pattern; a gate cutting pattern on a border between the first logic cell and the second logic cell, the gate cutting pattern being between the first gate electrode and the second gate electrode; an active contact electrically connected to at least one of the first source/drain patterns and the second source/drain patterns; a gate contact electrically connected to the first gate electrode; and metal layers stacked on the active contact and the gate contact. The gate cutting pattern may cover a first outermost side surface of the first channel pattern and a second outermost side surface of the second channel pattern.

According to an embodiment of inventive concepts, a semiconductor device may include a substrate including a logic cell, the logic cell including a PMOSFET region and an NMOSFET region, which are spaced apart from each other in a first direction, the logic cell having first to fourth borders, the first border and the second border being opposite to each other in a second direction crossing the first direction, the third border and the fourth border being opposite to each other in the first direction; a device isolation layer on the substrate, the device isolation layer defining a first active pattern on the PMOSFET region and a second active pattern on the NMOSFET region, the first active pattern and the second active patterns extending in the second direction, an upper portion of each of the first active pattern and the second active pattern protruding above the device isolation layer; a gate electrode crossing the first active pattern and the second active pattern, the gate electrode extending in the first direction; a first source/drain pattern and a second source/drain pattern, which are respectively in an upper portion of the first active pattern and an upper portion of the second active pattern, each of the first source/drain patterns and the second source/drain pattern being adjacent to a side of the gate electrode; a division structure on at least one of the first border and the second border; a first gate cutting pattern and a second gate cutting pattern, which are respectively on the third border and the fourth border, a first end of the gate electrode being in contact with the first gate cutting pattern, a second end of the gate electrode being in contact with the second gate cutting pattern; a gate spacer on at least one side surface of the gate electrode; a gate capping pattern on a top surface of the gate electrode; an interlayer insulating layer on the gate capping pattern; an active contact penetrating the interlayer insulating layer and being electrically connected to at least one of the first source/drain patterns and the second source/drain patterns; a gate contact penetrating the interlayer insulating layer and the gate capping pattern and being electrically connected to the gate electrode; a first metal layer on the interlayer insulating layer, the first metal layer including a first power line and a second power line respectively on the first gate cutting pattern and the second gate cutting pattern, and the first metal layer including first interconnection lines between the first power line and the second power line, the first interconnection lines being electrically and respectively connected to the active contact and the gate contact; and a second metal layer on the first metal layer. The second metal layer may include second interconnection lines electrically connected to the first metal layer. The upper portion of each of the first active pattern and the second active pattern may include a first side surface and a second side surface, which are opposite to each other. The first gate cutting pattern may cover the second side surface of the first active pattern, and the second gate cutting pattern may cover the second side surface of the second active pattern. The gate electrode may be on the first side surface of the first active pattern and the first side surface of the second active pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Example embodiments of inventive concepts will now be described more fully with reference to the accompanying drawings, in which example embodiments are shown.

Figure 1:
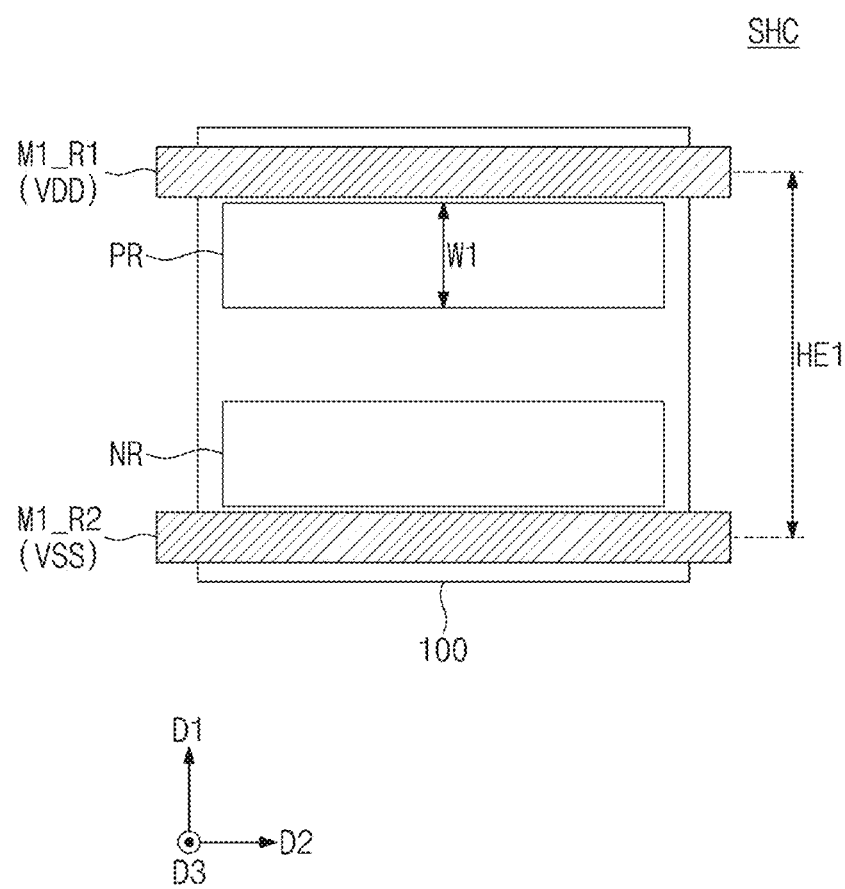
FIGS. 1 to 3 are conceptual diagrams illustrating logic cells of a semiconductor device according to an embodiment of inventive concepts.
Figure 2:
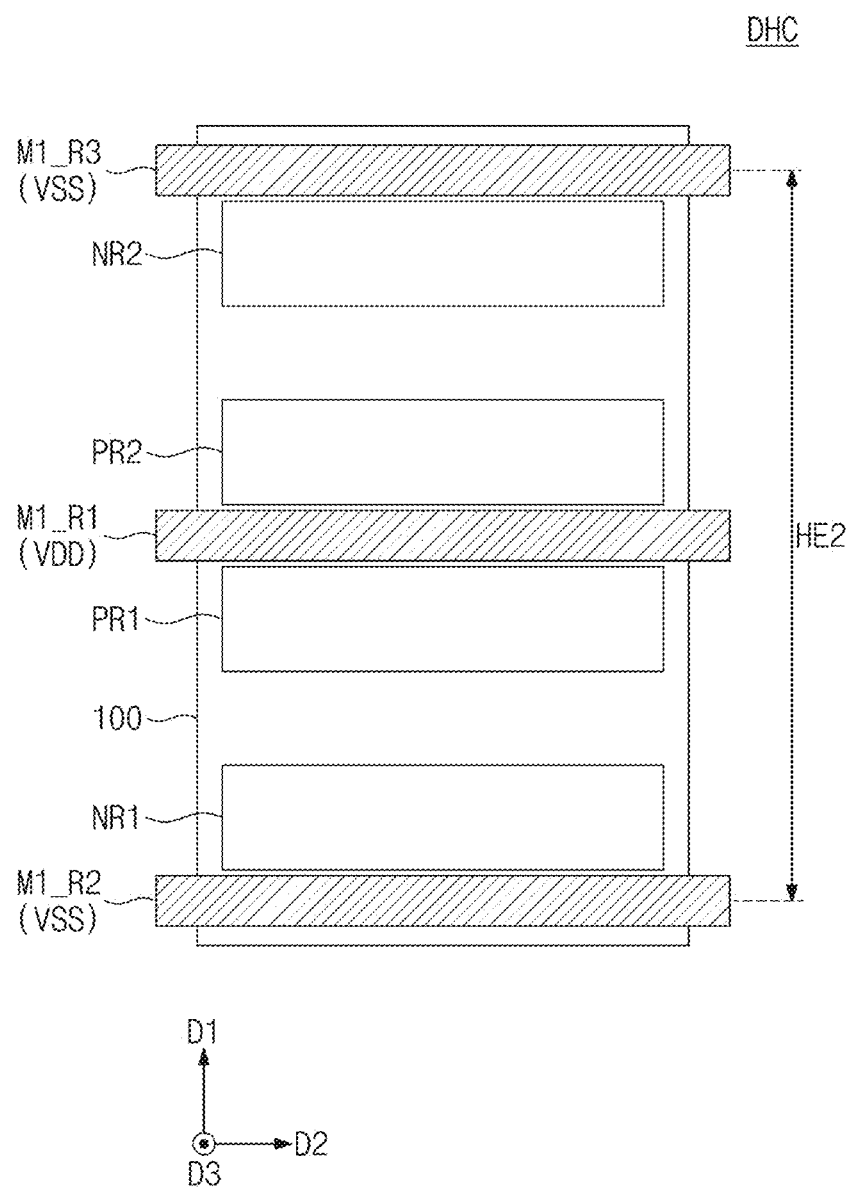
Figure 3:
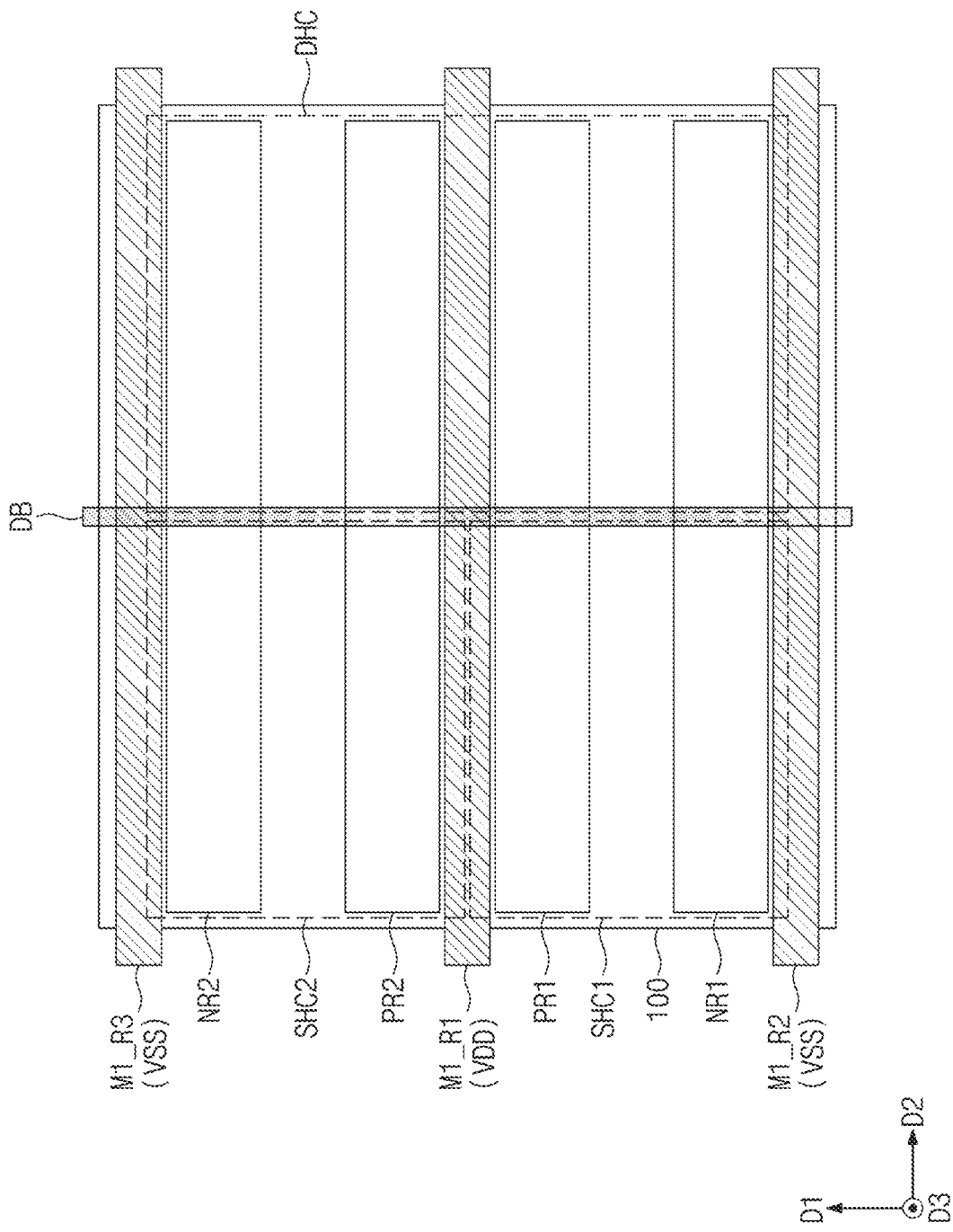

FIGS. 1 to 3 are conceptual diagrams illustrating logic cells of a semiconductor device according to an embodiment of inventive concepts.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first and second power lines M1_R1 and M1_R2. The single height cell SHC may include one PMOSFET region PR and one NMOSFET region NR. In other words, the single height cell SHC may have a CMOS structure provided between the first and second power lines M1_R1 and M1_R2.

Each of the PMOSFET and NMOSFET regions PR and NR may have a first width W1 in a first direction D1. A length of the single height cell SHC in the first direction D1 may be defined as a first height HE1. The first height HE1 may be substantially equal to a distance (e.g., a pitch) between the first power line M1_R1 and the second power line M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage VSS is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a PMOS transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2 and a double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. An active region of the double height cell DHC may be electrically separated from an active region of each of the first and second single height cells SHC1 and SHC2 by the division structure DB.

Figure 4:
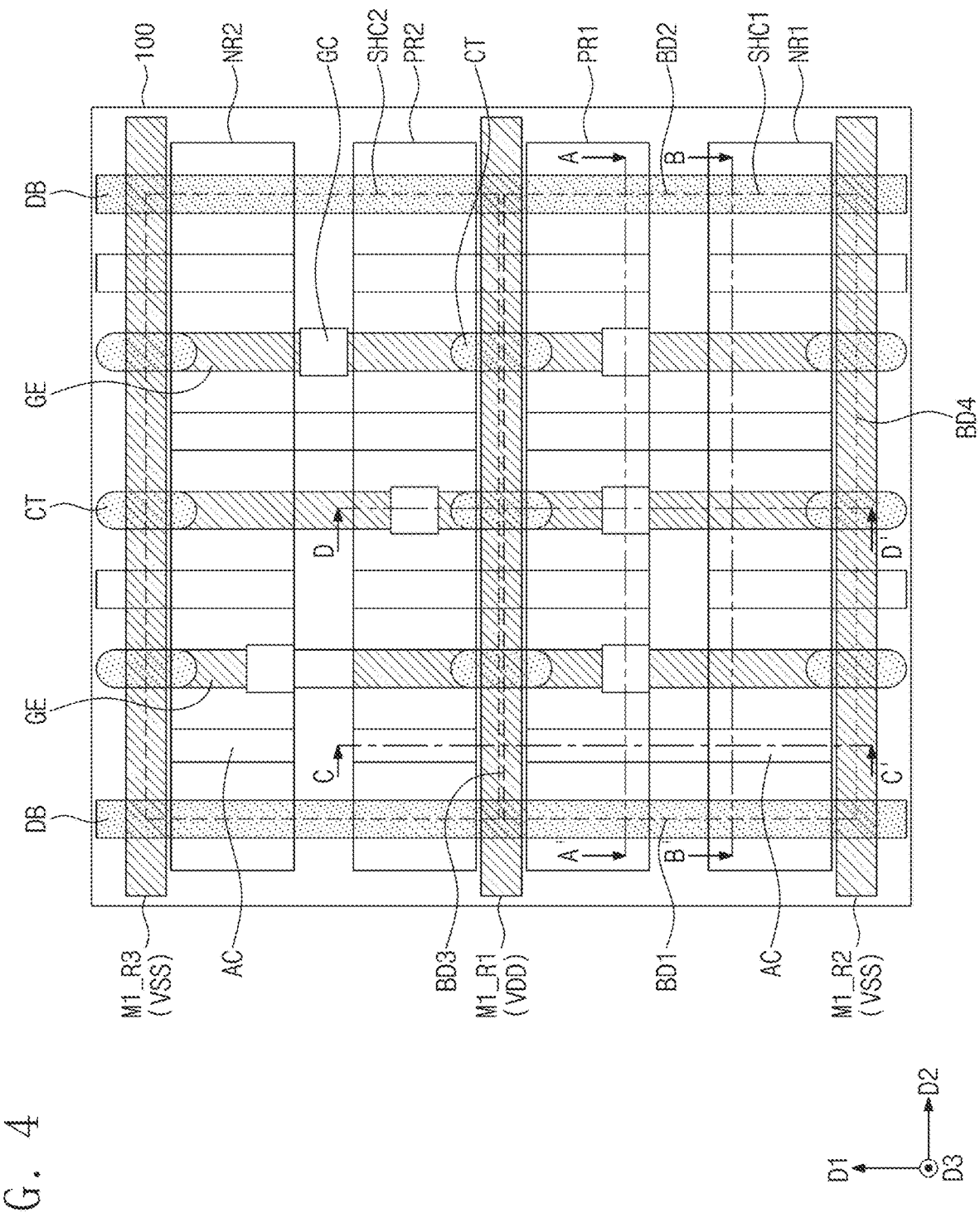
FIG. 4 is a plan view illustrating a semiconductor device according to an embodiment of inventive concepts.

FIG. 4 is a plan view illustrating a semiconductor device according to an embodiment of inventive concepts. FIGS. 5A to 5D are sectional views taken along lines A-A', B-B', C-C', and D-D', respectively, of FIG. 4. FIGS. 4 and 5A to 5E illustrate an example of a detailed structure of the first and second single height cells SHC1 and SHC2 of FIG. 3.

Referring to FIGS. 4 and 5A to 5D, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes silicon, germanium, silicon-germanium, a compound semiconductor material, or the like. As an example, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended in the second direction D2.

The first PMOSFET region PR1, the second PMOSFET region PR2, the first NMOSFET region NR1, and the second NMOSFET region NR2 may be defined by a second trench TR2, which is formed in an upper portion of the substrate 100. For example, the second trench TR2 may be located between the first NMOSFET region NR1 and the first PMOSFET region PR1. The second trench TR2 may be located between the first PMOSFET region PR1 and the second PMOSFET region PR2. The second trench TR2 may be located between the second PMOSFET region PR2 and the second NMOSFET region NR2.

First active patterns AP1 may be provided on each of the first and second PMOSFET regions PR1 and PR2. Second active patterns AP2 may be provided on each of the first and second NMOSFET regions NR1 and NR2.

The first and second active patterns AP1 and AP2 may be extended in the second direction D2 to be parallel to each other. The first and second active patterns AP1 and AP2 may be vertically protruding portions of the substrate 100. A first trench TR1 may be defined between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. An upper portion of each of the first and second active patterns AP1 and AP2 may be a protruding pattern, which is vertically extended above the device isolation layer ST (e.g., see FIG. 5D). The upper portion of each of the first and second active patterns AP1 and AP2 may have a fin shape. The device isolation layer ST may not cover the upper portion of each of the first and second active patterns AP1 and AP2. The device isolation layer ST may cover a lower side surface of each of the first and second active patterns AP1 and AP2.

First source/drain patterns SD1 may be provided on each of the first and second PMOSFET regions PR1 and PR2. The first source/drain patterns SD1 may be provided in the upper portion of each of the first active patterns AP1. The first source/drain patterns SD1 may be impurity regions of a first conductivity type (e.g., p-type). A first channel pattern CH1 may be interposed between each pair of the first source/drain patterns SD1, which are adjacent to each other in the second direction D2.

Second source/drain patterns SD2 may be provided on each of the first and second NMOSFET regions NR1 and NR2. The second source/drain patterns SD2 may be provided in the upper portion of each of the second active patterns AP2. The second source/drain patterns SD2 may be impurity regions of a second conductivity type (e.g., n-type). A second channel pattern CH2 may be interposed between each pair of the second source/drain patterns SD2, which are adjacent to each other in the second direction D2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain pattern SD1 may include a semiconductor material (e.g., SiGe) having a lattice constant greater than that of the substrate 100. In this case, the pair of the first source/drain patterns SD1 may exert a compressive stress on the first channel pattern CH1 therebetween. In an embodiment, the second source/drain pattern SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged at a first pitch in the second direction D2. The gate electrodes GE may be vertically overlapped with the first and second channel patterns CH1 and CH2. Each of the gate electrodes GE may be provided to face a top surface and opposite side surfaces of each of the first and second channel patterns CH1 and CH2.

Referring back to FIG. 5D, the gate electrode GE may be provided on a first top surface TS1 and at least one of first side surfaces SW1 of the channel pattern CH1 or CH2. In other words, the transistor according to the present embodiment may be a three-dimensional field-effect transistor (e.g., FinFET), in which the gate electrode GE is provided to three-dimensionally surround the channel patterns CH1 and CH2.

As an example, the first single height cell SHC1 may have a first border BD1 and a second border BD2, which are opposite to each other in the second direction D2. The first and second borders BD1 and BD2 may be extended in the first direction D1. The first single height cell SHC1 may have a third border BD3 and a fourth border BD4, which are opposite to each other in the first direction D1. The third and fourth borders BD3 and BD4 may be extended in the second direction D2.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be disposed to be overlapped with the gate electrodes GE, respectively. The gate cutting patterns CT may be formed of or include at least one of insulating materials (e.g., silicon oxide or silicon nitride).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. In other words, the gate electrode GE extending in the first direction D1 may be divided into a plurality of the gate electrodes GE by the gate cutting patterns CT.

Referring back to FIGS. 4 and 5A to 5D, a pair of gate spacers GS may be disposed on opposite side surfaces of each of the gate electrodes GE. The gate spacers GS may be extended along the gate electrodes GE and in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may be a multi-layered structure, which includes at least two different materials selected from SiCN, SiCON, and SiN.

A gate capping pattern GP may be provided on each of the gate electrodes GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first active pattern AP1 and between the gate electrode GE and the second active pattern AP2. The gate insulating layer GI may be extended along a bottom surface of the gate electrode GE thereon. As an example, the gate insulating layer GI may cover the first top surface TS1 and the first side surface SW1 of the channel pattern CH1 or CH2. The gate insulating layer GI may cover a top surface of the device isolation layer ST below the gate electrode GE (e.g., see FIG. 5D).

In an embodiment, the gate insulating layer GI may be formed of or include a high-k dielectric material whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. In contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI to be adjacent to the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metallic material, which is selected from the group consisting of titanium (Ti), tantalum (Ta), aluminum (Al), tungsten (W) and molybdenum (Mo), and nitrogen (N). The first metal pattern may further contain carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta).

The first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, the pair of the division structures DB may be provided on the first and second borders BD1 and BD2, respectively, of the first single height cell SHC1. The isolation structure DB may be extended in the first direction D1 and parallel to the gate electrodes GE. A pitch between the division structure DB and the gate electrode GE adjacent thereto may be equal to the first pitch.

The division structure DB may penetrate the first and second interlayer insulating layers 110 and 120 and may be extended into the first and second active patterns AP1 and AP2. The division structure DB may penetrate an upper portion of each of the first and second active patterns AP1 and AP2. The division structure DB may electrically separate an active region of each of the first and second single height cells SHC1 and SHC2 from an active region of a neighboring cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE. When viewed in a plan view, each of the active contacts AC may be a bar- or line-shaped pattern extending in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Silicide patterns SC may be respectively interposed between the active contacts AC and the first and second source/drain patterns SD1 and SD2. The active contacts AC may be electrically connected to the first and second source/drain patterns SD1 and SD2, respectively, through the silicide patterns SC. The silicide pattern SC may be formed of or include at least one of metal silicide materials (e.g., titanium silicide, tantalum silicide, tungsten silicide, nickel silicide, or cobalt silicide).

Referring back to FIG. 5C, at least one of the active contacts AC on the first single height cell SHC1 may be used to electrically connect the first source/drain pattern SD1 of the first PMOSFET region PR1 to the second source/drain pattern SD2 of the first NMOSFET region NR1. The active contact AC may be extended from the second source/drain pattern SD2 of the first NMOSFET region NR1 to the first source/drain pattern SD1 of the first PMOSFET region PR1 in the first direction D1. The active contact AC may include a first body portion BP1 on the first source/drain pattern SD1 and a second body portion BP2 on the second source/drain pattern SD2. The first body portion BP1 may be connected to the top surface of the first source/drain pattern SD1 through the silicide pattern SC, and the second body portion BP2 may be connected to the top surface of the second source/drain pattern SD2 through the silicide pattern SC. A first active contact AC1 may further include a protruding portion PP, which is interposed between the first body portion BP1 and the second body portion BP2. The protruding portion PP may be provided on the device isolation layer ST between the first PMOSFET and NMOSFET regions PR1 and NR1.

The protruding portion PP may be extended from the first body portion BP1 toward the device isolation layer ST along a slanted side surface of the first source/drain pattern SD1. The protruding portion PP may be extended from the second body portion BP2 toward the device isolation layer ST along a slanted side surface of the second source/drain pattern SD2. The protruding portion PP may have a bottom surface that is lower than a bottom surface of each of the first and second body portions BP1 and BP2. The bottom surface of the protruding portion PP may be located at a level higher than the device isolation layer ST. In other words, the protruding portion PP may be spaced apart from the device isolation layer ST with the first interlayer insulating layer 110 interposed therebetween.

In an embodiment, the active contact AC may be connected to the top surface of the first source/drain pattern SD1 through the first body portion BP1 and may also be connected to the slanted side surface of the first source/drain pattern SD1 through the protruding portion PP. In other words, the protruding portion PP may increase a contact area between the active contact AC and the first source/drain pattern SD1. Thus, a resistance between the active contact AC and the first source/drain pattern SD1 may be reduced. Similar, the protruding portion PP may reduce a resistance between the active contact AC and the second source/drain pattern SD2. As a result, it may be possible to improve an operation property (e.g., an operation speed) of the semiconductor device according to an embodiment of inventive concepts.

Gate contacts GC, which are electrically and respectively connected to the gate electrodes GE, may be provided to penetrate the second interlayer insulating layer 120 and the gate capping pattern GP. When viewed in a plan view, the gate contacts GC on the first single height cell SHC1 may be disposed to be overlapped with the first PMOSFET region PR1. In other words, the gate contacts GC on the first single height cell SHC1 may be provided on the first active pattern AP1 (e.g., see FIG. 5A).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the second trench TR2.

Figure 5A:
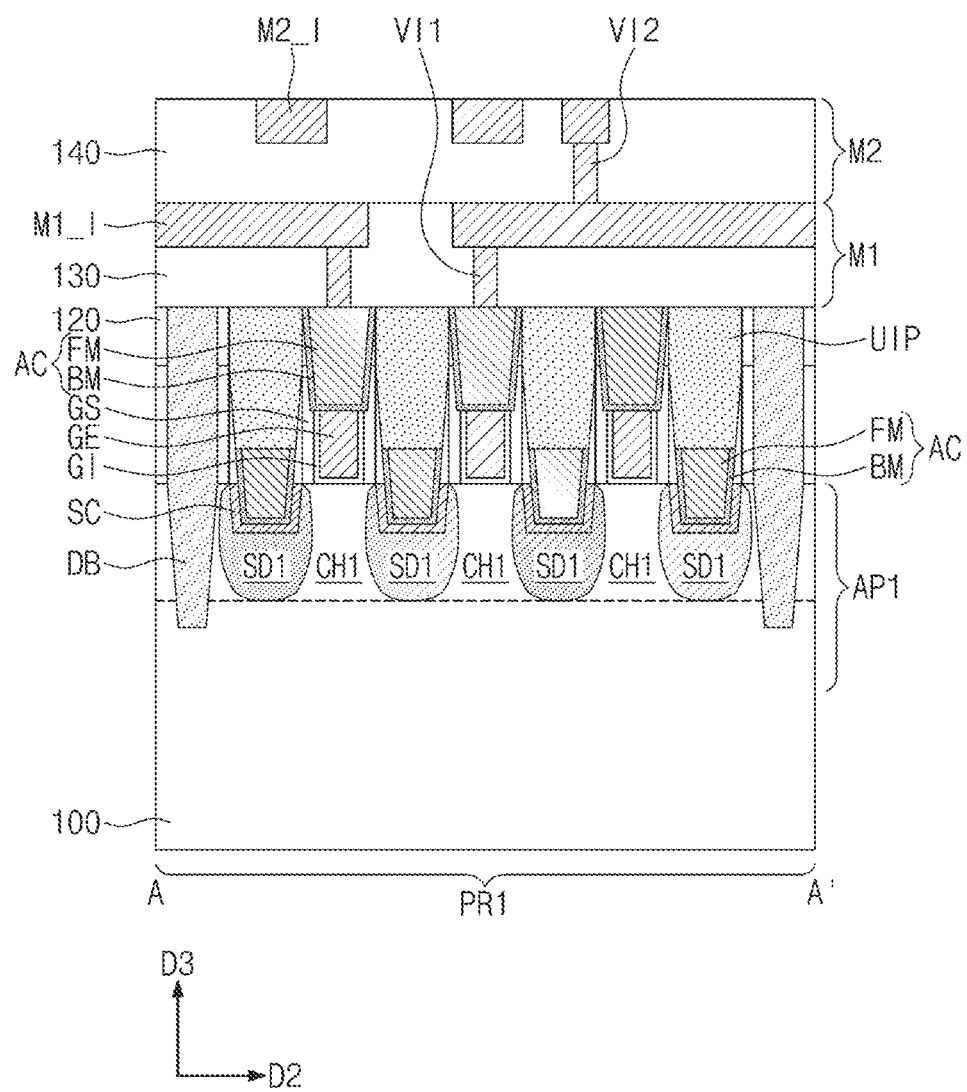
FIGS. 5A to 5D are sectional views taken along lines A-A', B-B', C-C', and D-D', respectively, of FIG. 4.
Figure 5B:
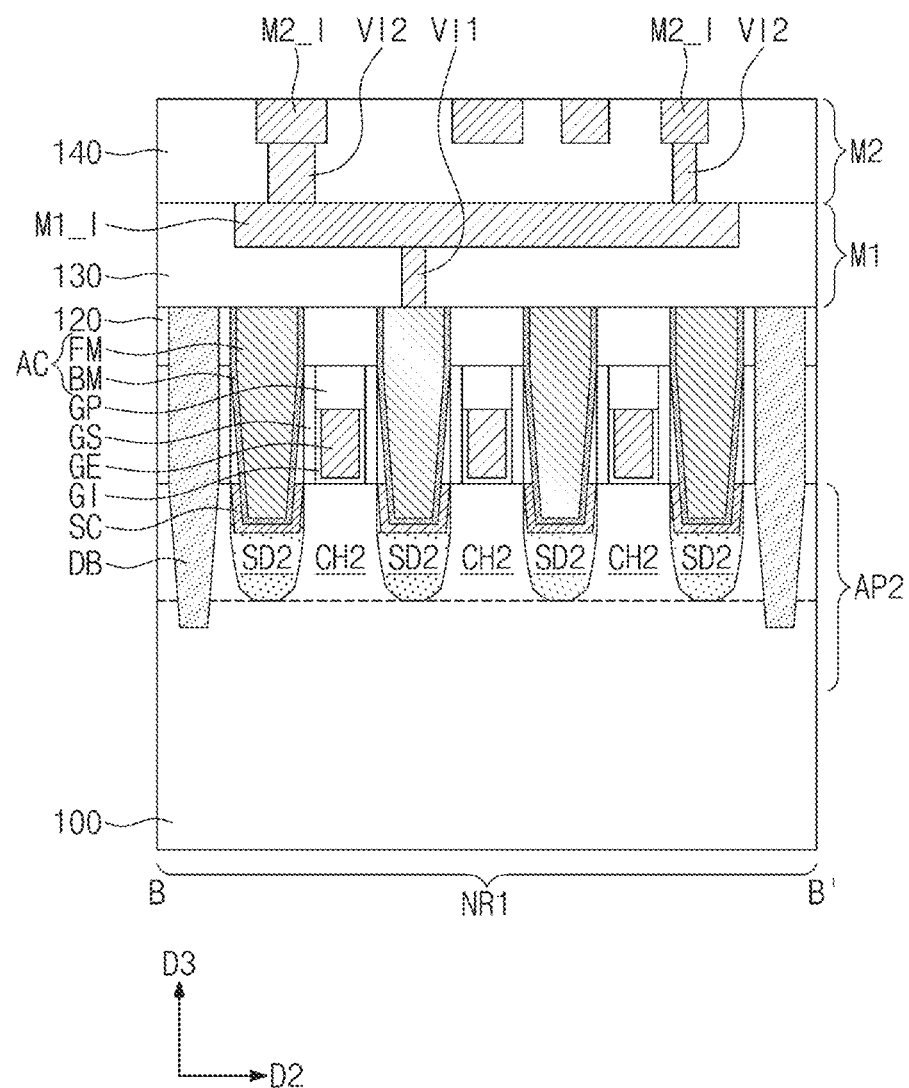
Figure 5C:
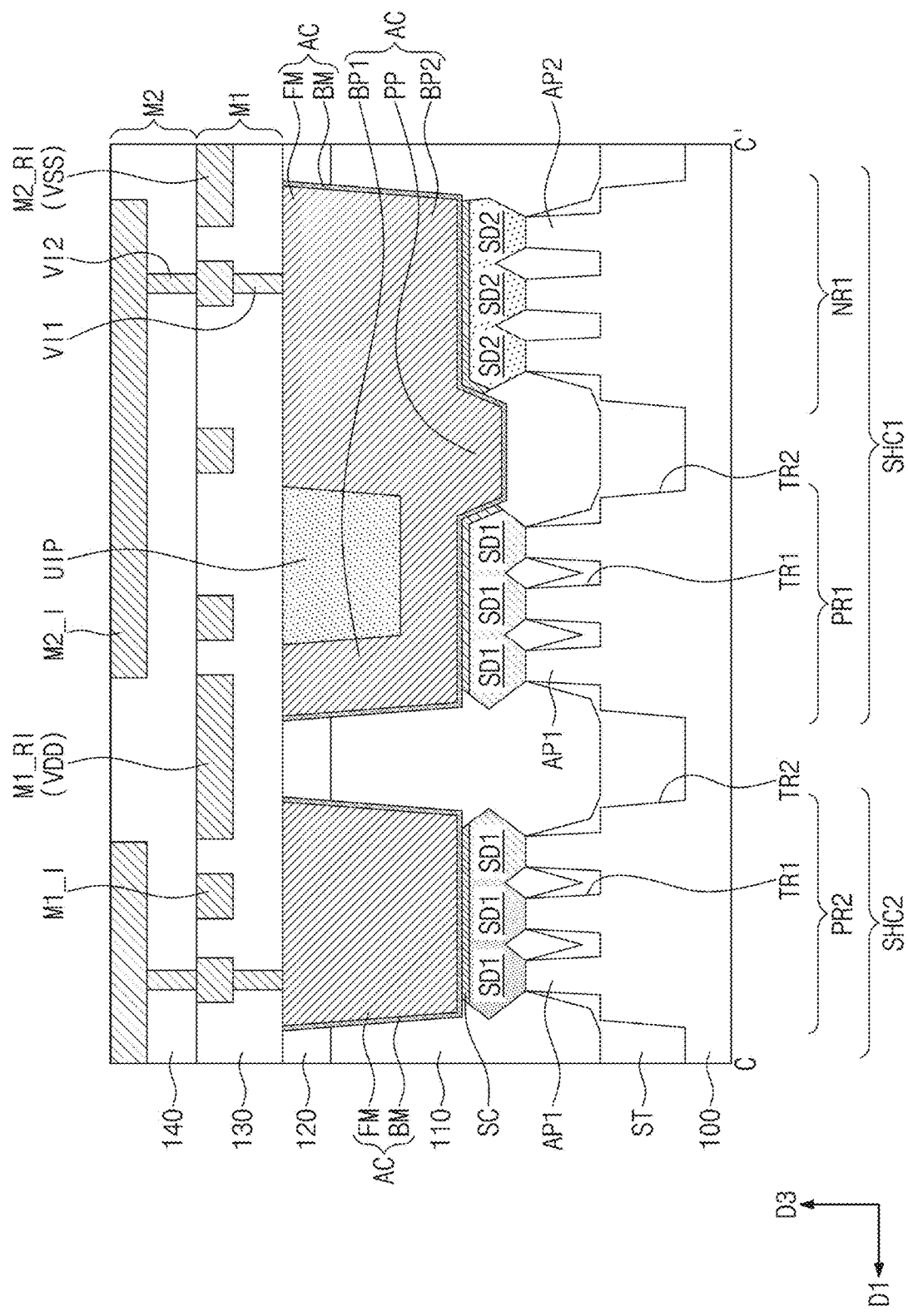

In an embodiment, referring to FIGS. 5A and 5C, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, or cobalt). The barrier pattern BM may cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may be extended in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be arranged at a second pitch in the first direction D1. The second pitch may be smaller than the first pitch. A line width of each of the first interconnection lines M1_I may be smaller than a line width of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from that of the second metal layer M2. For example, the interconnection lines of the first and second metal layers M1 and M2 may be formed of or include at least one of metallic materials (e.g., aluminum, copper, tungsten, molybdenum, or cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Referring back to FIG. 5D, the gate electrode GE on the first single height cell SHC1 may include a first end EN1 and a second end EN2. Each of the first and second ends EN1 and EN2 may be in contact with the gate cutting pattern CT. The first active patterns AP1 on the first PMOSFET region PR1 may include a first outermost active pattern AP1_p, which is in contact with the gate cutting pattern CT. The second active patterns AP2 on the first NMOSFET region NR1 may include a second outermost active pattern AP2_p, which is in contact with the gate cutting pattern CT.

In detail, the first outermost active pattern AP1_p may include a second top surface TS2, a second side surface SW2, and a third side surface SW3, which is opposite to the second side surface SW2. The second top surface TS2 and the second side surface SW2 may be covered with the gate insulating layer GI. The second top surface TS2 and the second side surface SW2 may face the gate electrode GE with the gate insulating layer GI interposed therebetween. In other words, the second top surface TS2 and the second side surface SW2 may be vertically overlapped with the gate electrode GE. The third side surface SW3 may not be covered with the gate insulating layer GI. The third side surface SW3 may be in contact with the gate cutting pattern CT. The third side surface SW3 may not be vertically overlapped with the gate electrode GE.

The first end EN1 of the gate electrode GE may not be extended beyond the third side surface SW3 of the first outermost active pattern AP1_p, and the second end EN2 of the gate electrode GE may not be extended beyond the third side surface SW3 of the second outermost active pattern AP2_p. The gate electrode GE may have a first length L1 (e.g., a length from the first end EN1 to the second end EN2) in the first direction D1. The gate cutting pattern CT may have a second length L2 in the first direction D1.

Figure 5D:
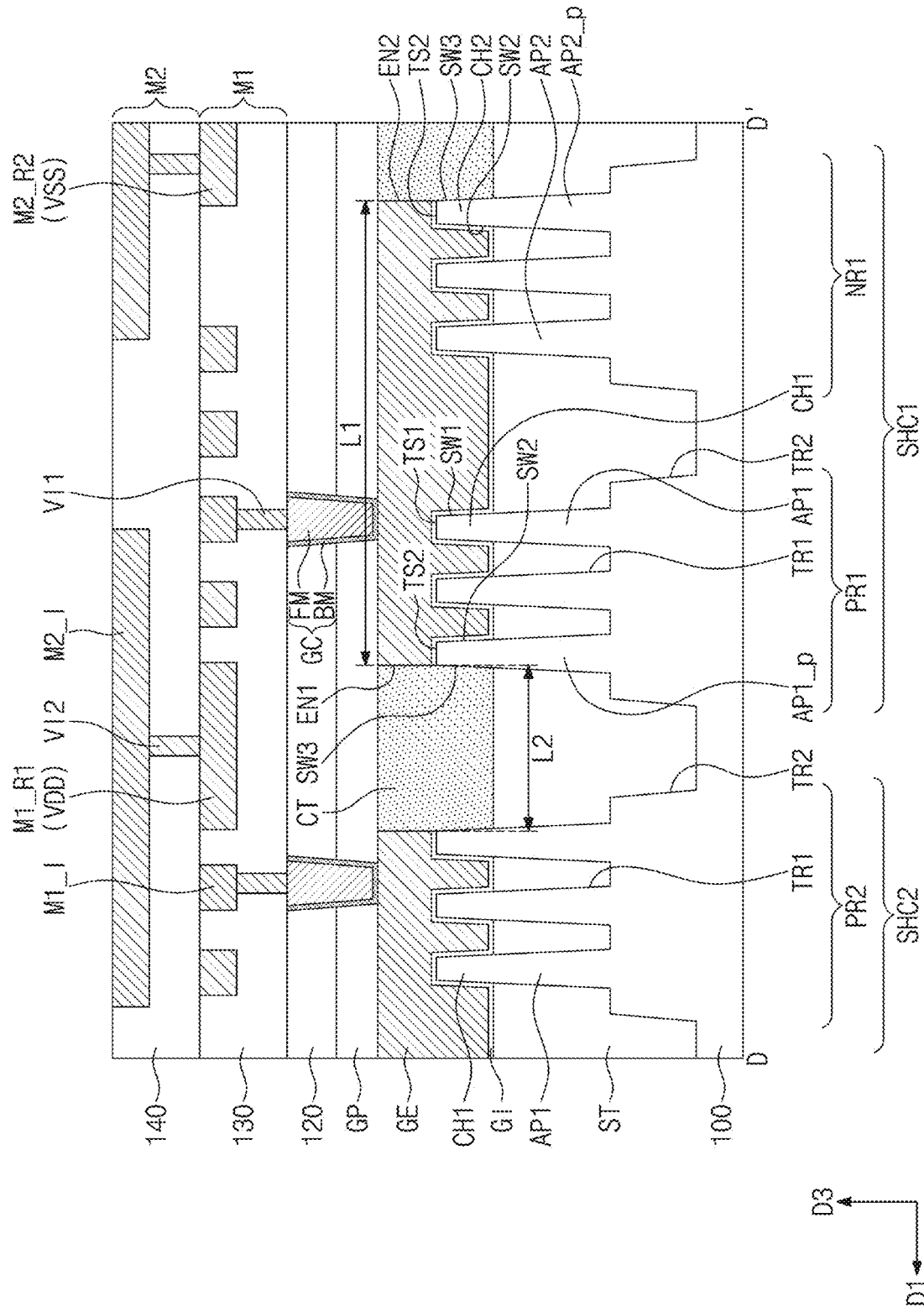
Figure 6:
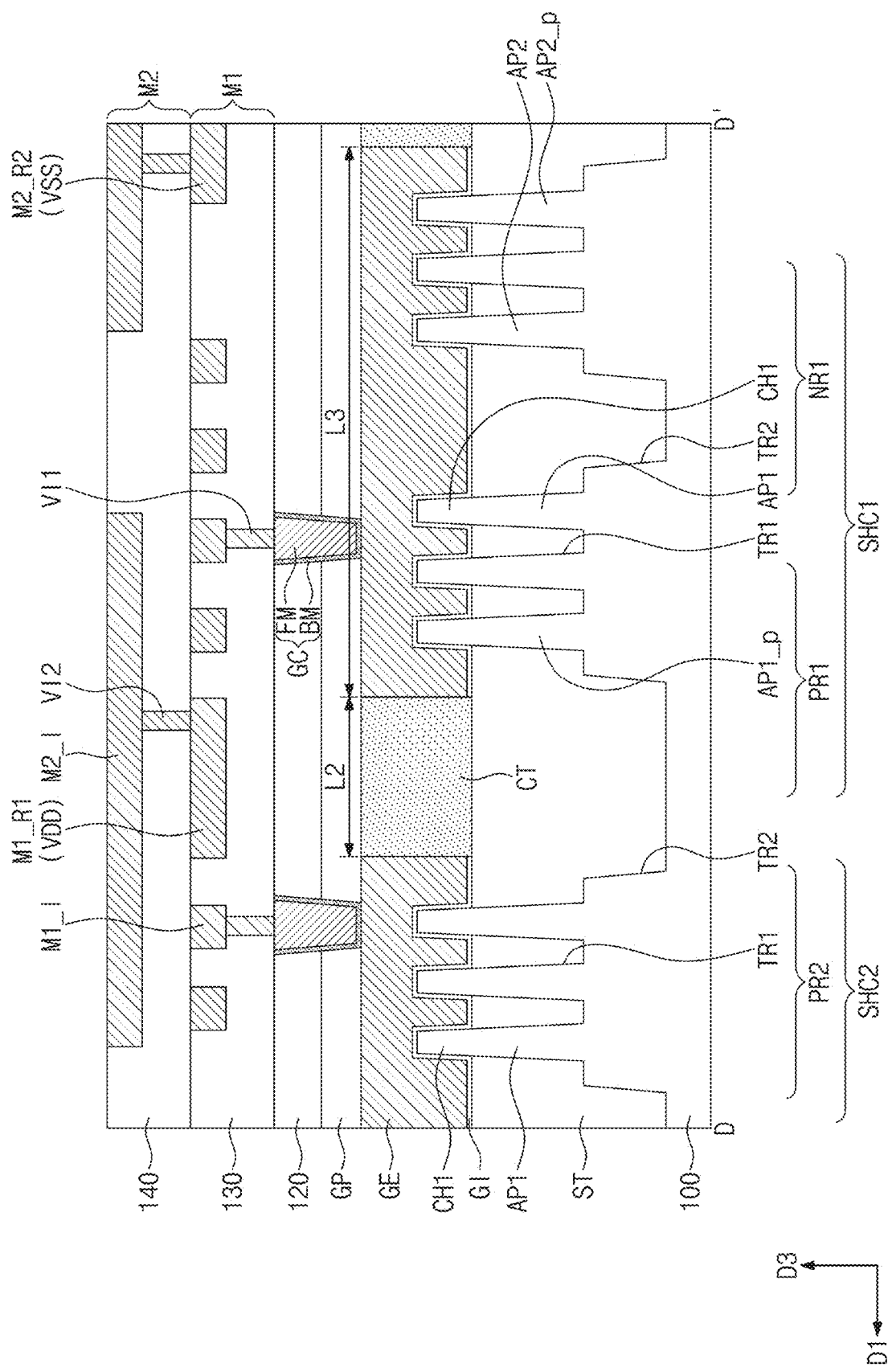
FIG. 6 is a sectional view, which is taken along a line D-D' of FIG. 4 to illustrate a semiconductor device according to a comparative example of inventive concepts.
Figure 7:
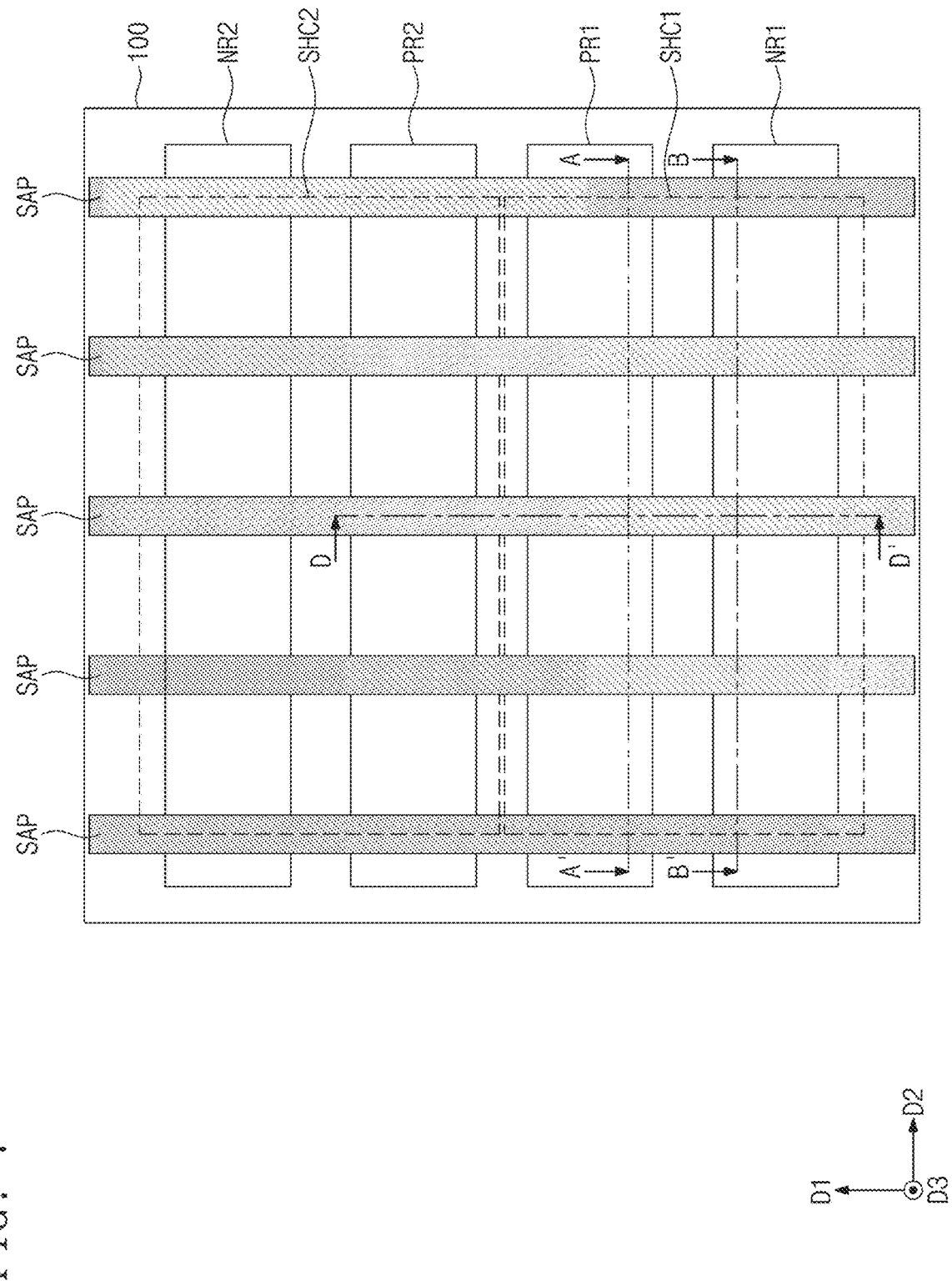
FIGS. 7, 9, 11, and 13 are plan views illustrating a method of fabricating a semiconductor device according to an embodiment of inventive concepts.

FIG. 6 is a sectional view, which is taken along a line D-D' of FIG. 4 to illustrate a semiconductor device according to a comparative example of inventive concepts. Referring to FIG. 6, the gate electrode GE of FIG. 6 may cover both of the first and second outermost active patterns AP1_p and AP2_p, unlike the gate electrode GE previously described with reference to FIG. 5D. In other words, the gate electrode GE of FIG. 6 may have a third length L3 that is larger than the first length L1 of FIG. 5D. Since the gate electrode GE of FIG. 6 on the first single height cell SHC1 has the third length L3 that is relatively large, the cell height HE1 previously described with reference to FIG. 1 may be relatively increased. In the case where the cell height HE1 of the single height cell SHC is increased, two-dimensional arrangement of them may require an increased chip area.

Meanwhile, referring back to FIG. 5D, the semiconductor device according to the present embodiment may include the gate electrode GE having a relatively small length (e.g., the first length L1). Accordingly, it may be possible to reduce the cell height HE1 of the single height cell SHC of FIG. 1. Since the cell height of each of the logic cells is reduced, it may be possible to reduce an area of a chip, in which they are two-dimensionally disposed. As a result, the semiconductor device in the present embodiment may have an increased integration density.

Each of the first and second active patterns AP1 and AP2 according to the present embodiment may have a thin body structure. In this case, the semiconductor device according to the present embodiment may have substantially the same characteristics as a fully-depleted device. Accordingly, even when, as shown in FIG. 5D, the gate electrode GE in the present embodiment does not cover the third side surface SW3 of the first outermost active pattern AP1_p, a punch-through issue may not occur between source and drain electrodes. In other words, the first outermost active pattern AP1_p may serve as a body of a normal transistor.

Figure 10A:
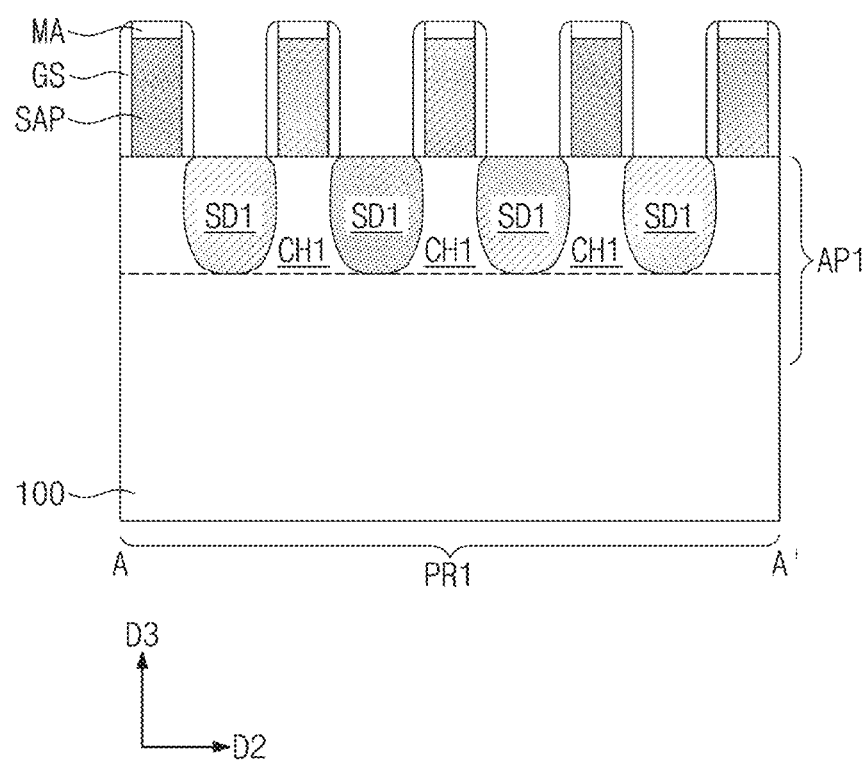
Figure 10B:
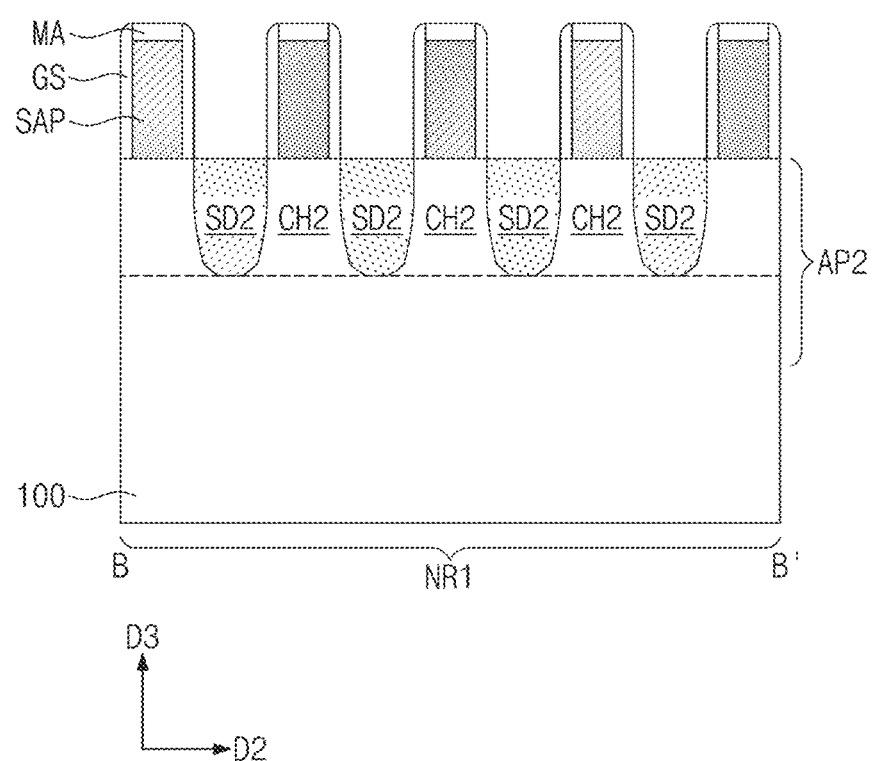
Figure 10C:
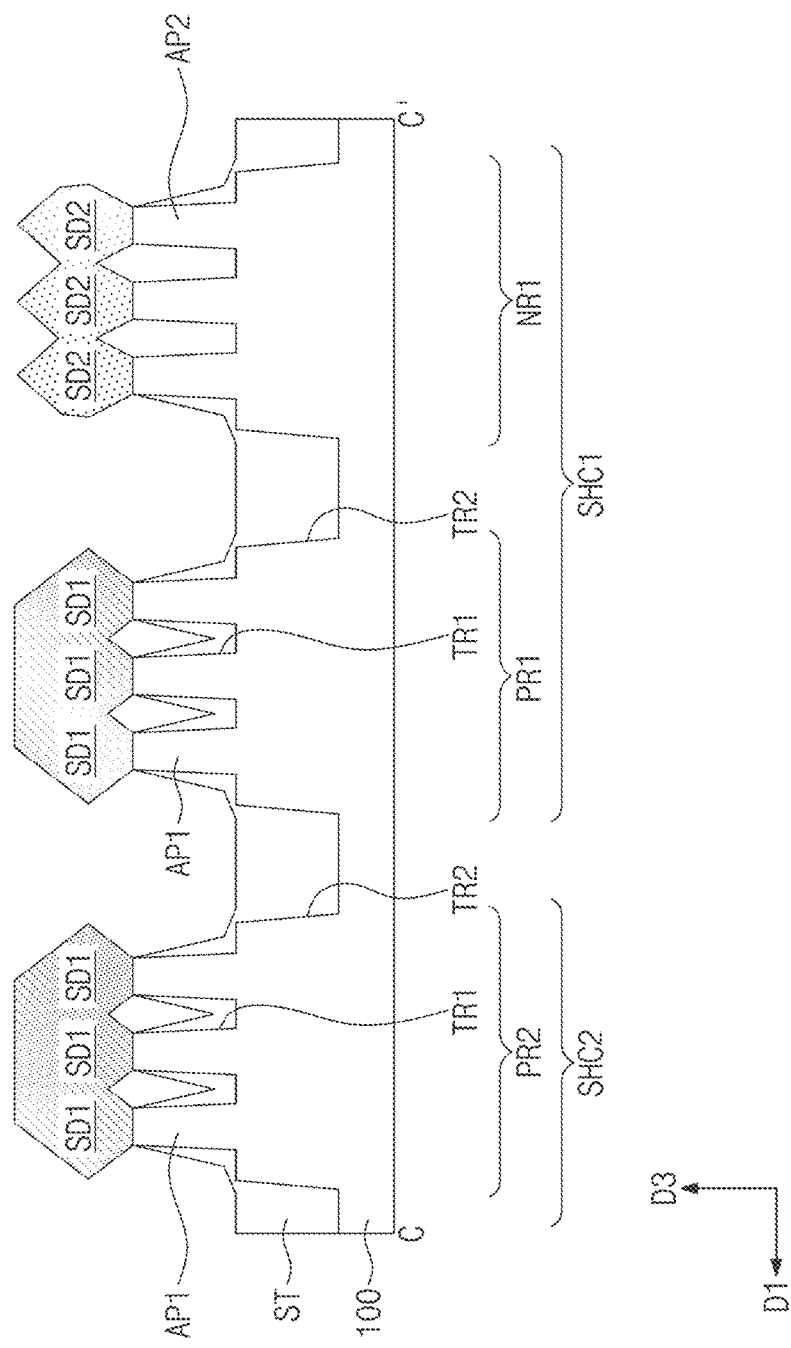
FIGS. 10C, 12C, and 14C are sectional views taken along lines C-C' of FIGS. 7, 9, 11, and 13, respectively.
Figure 10D:
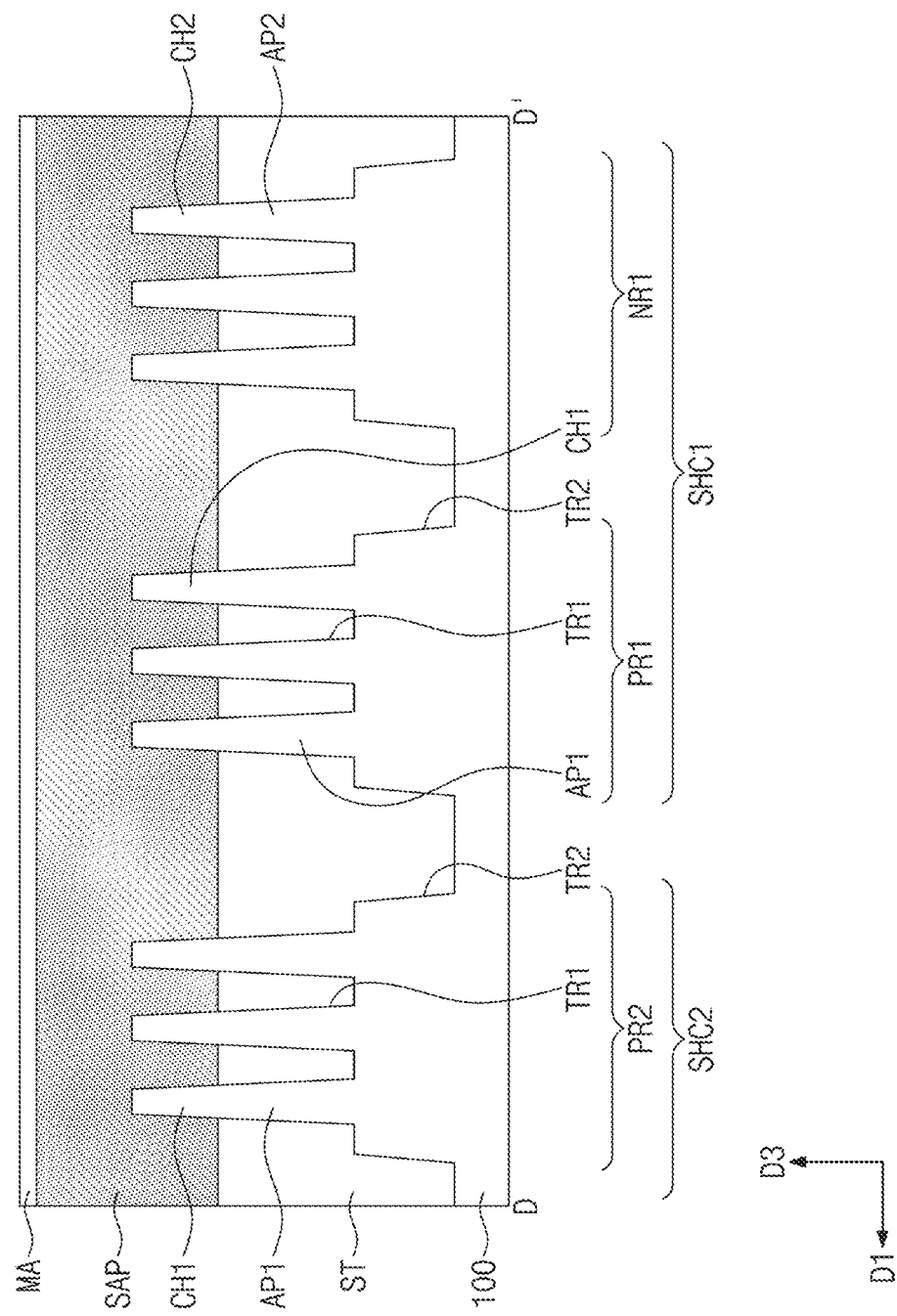
Figure 11:
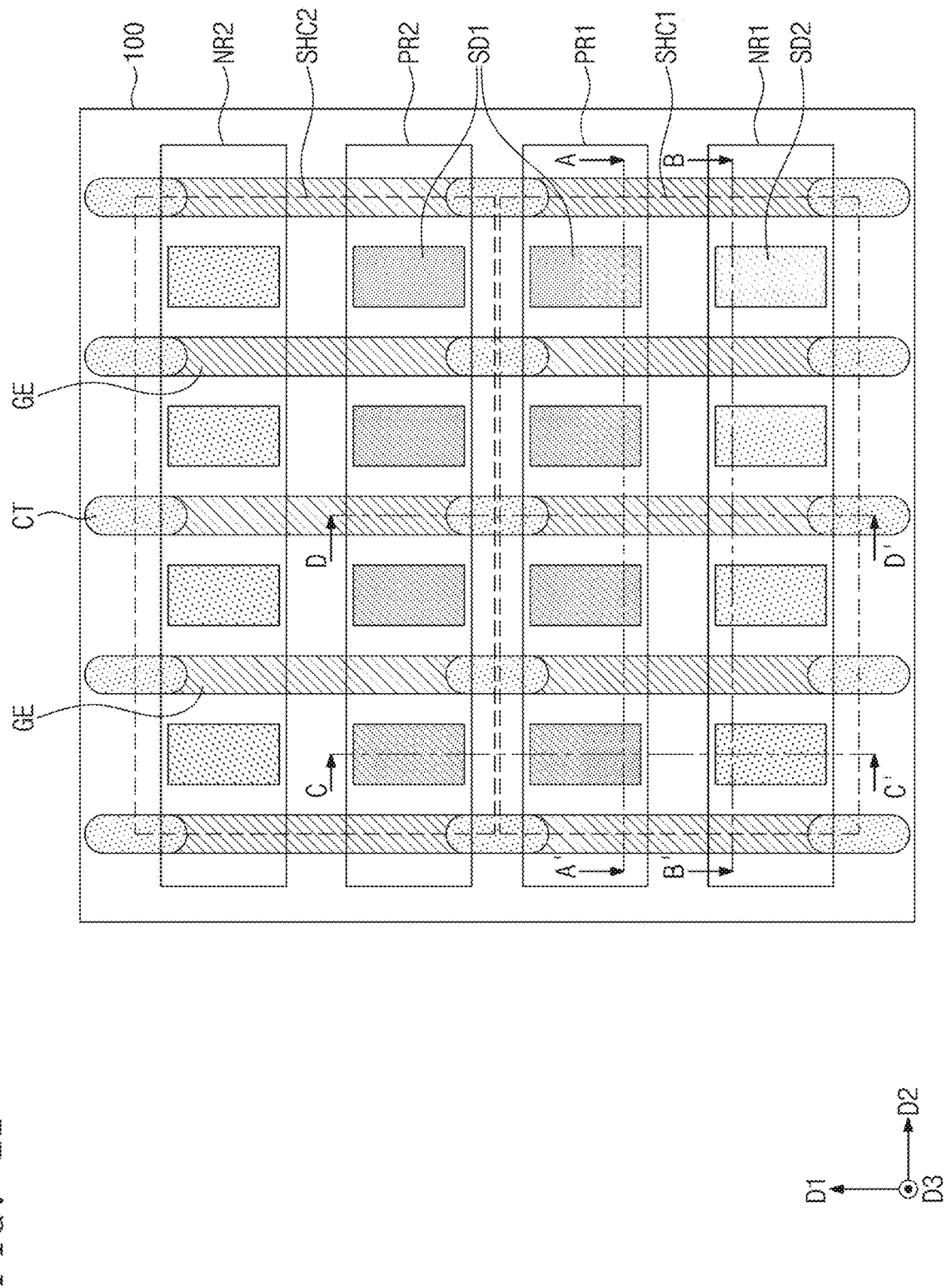
Figure 12A:
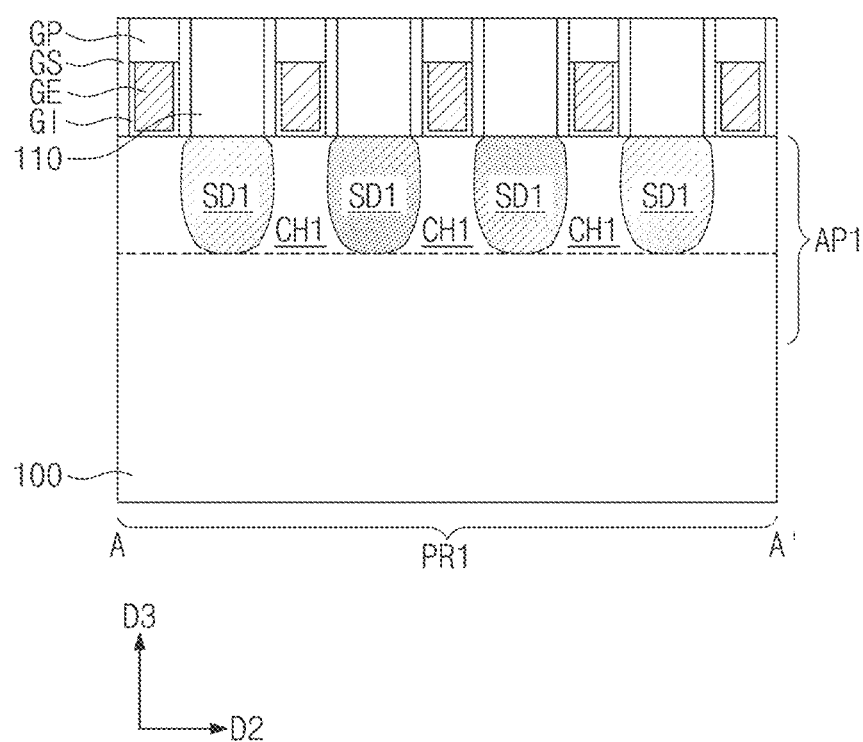
Figure 12B:
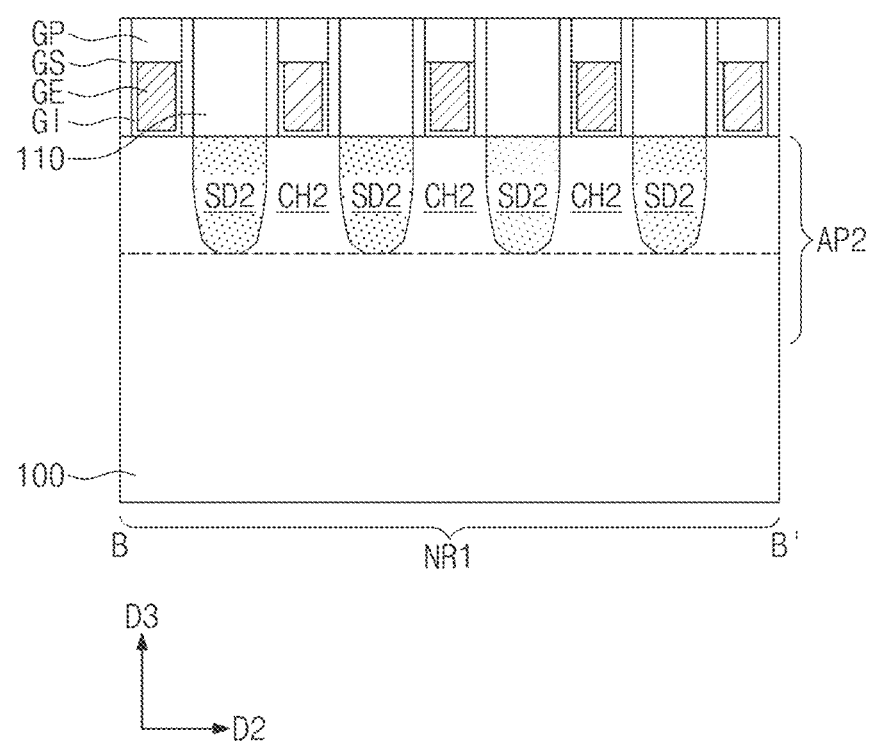
Figure 12C:
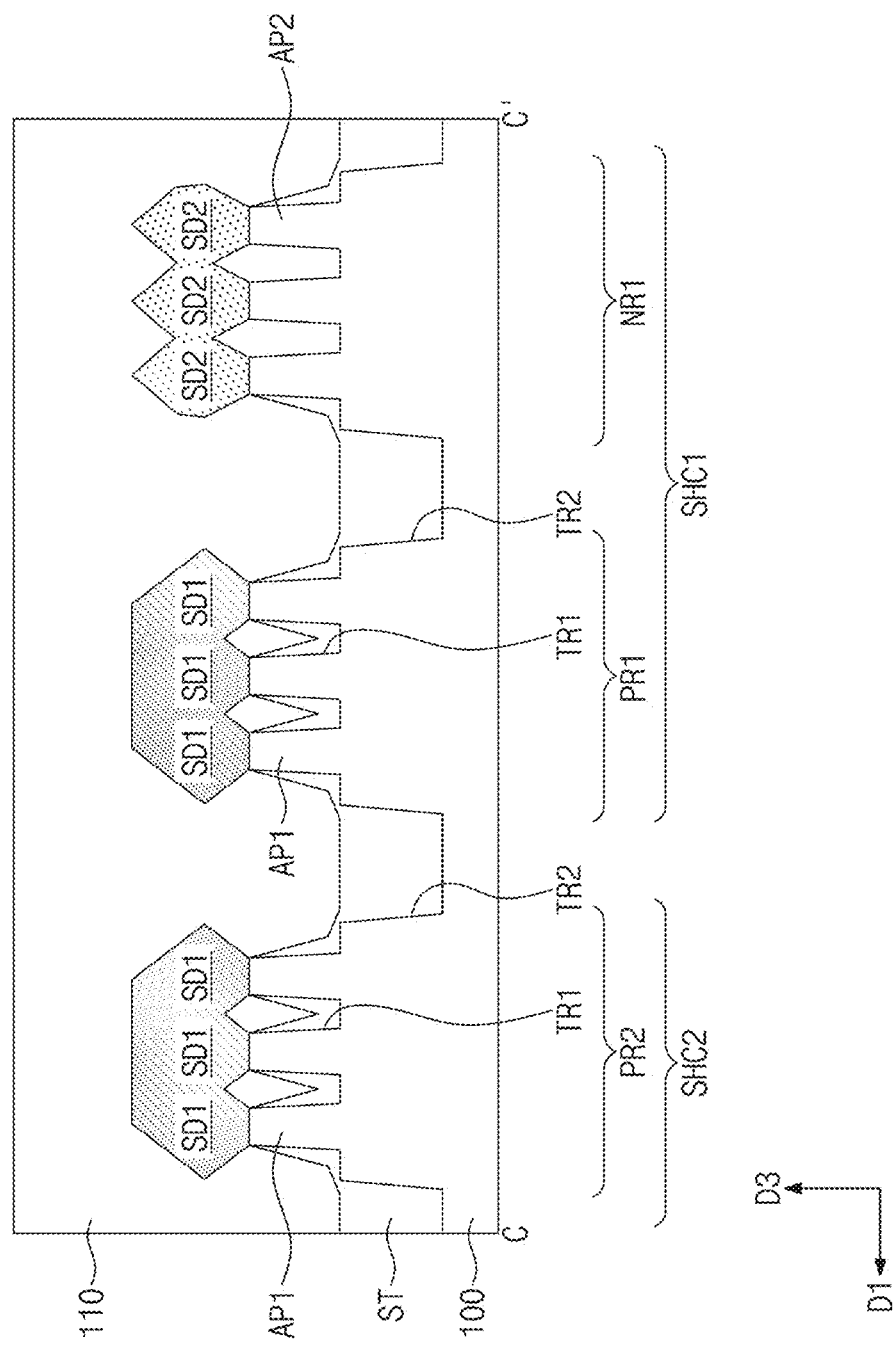
Figure 12D:
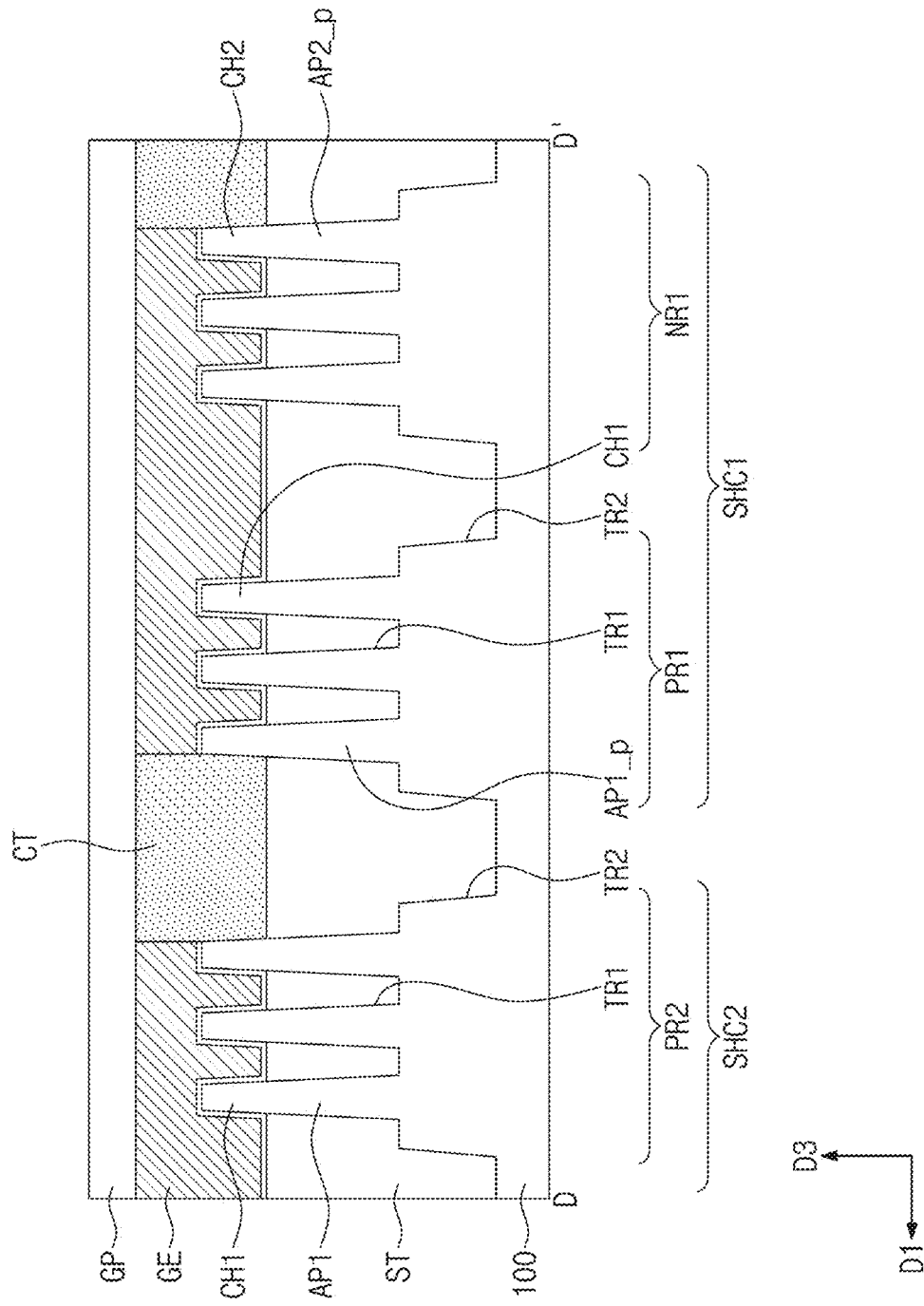
Figure 13:
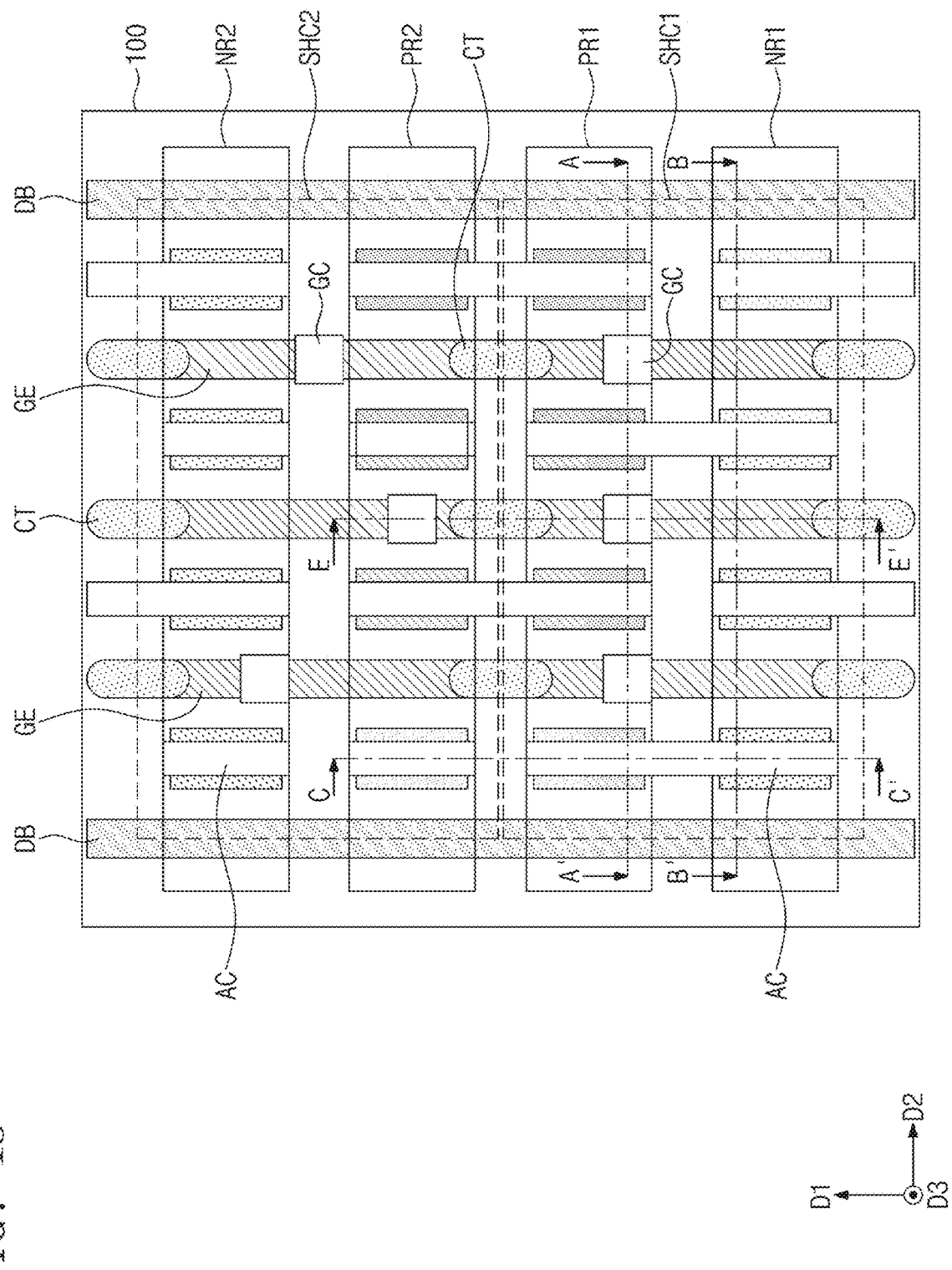
Figure 14A:
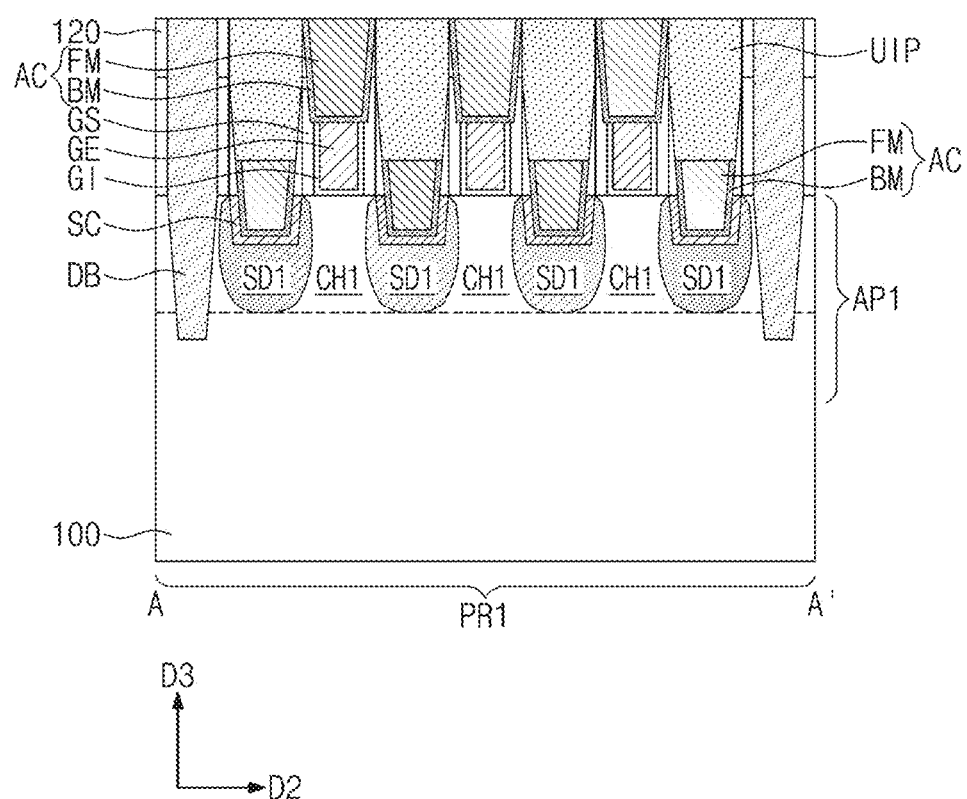
Figure 14B:
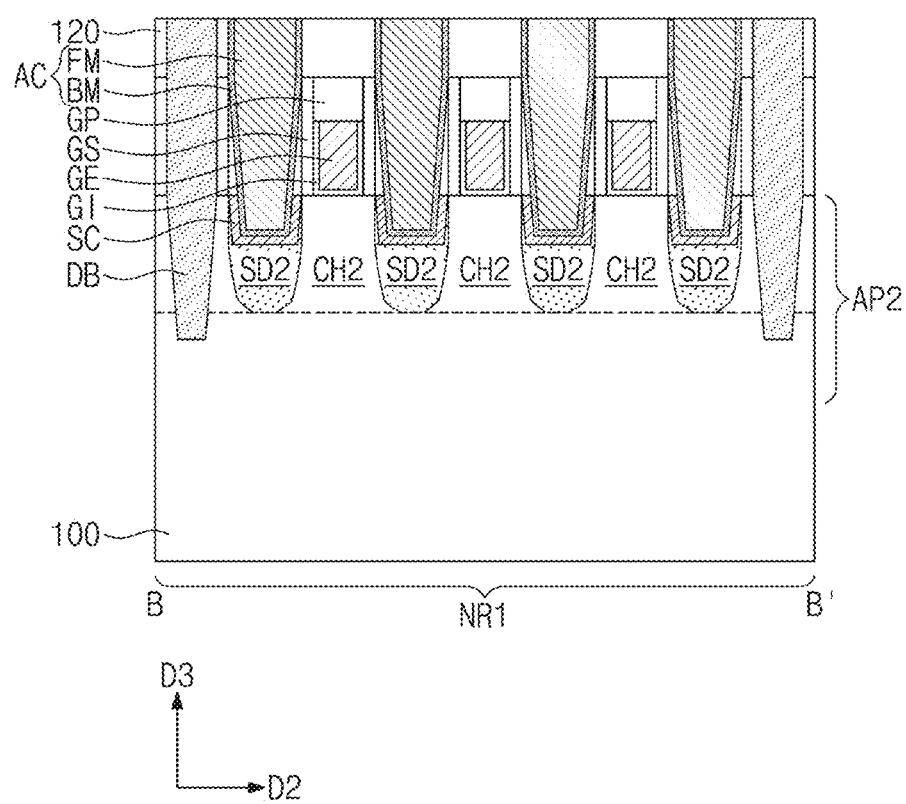
Figure 14C:
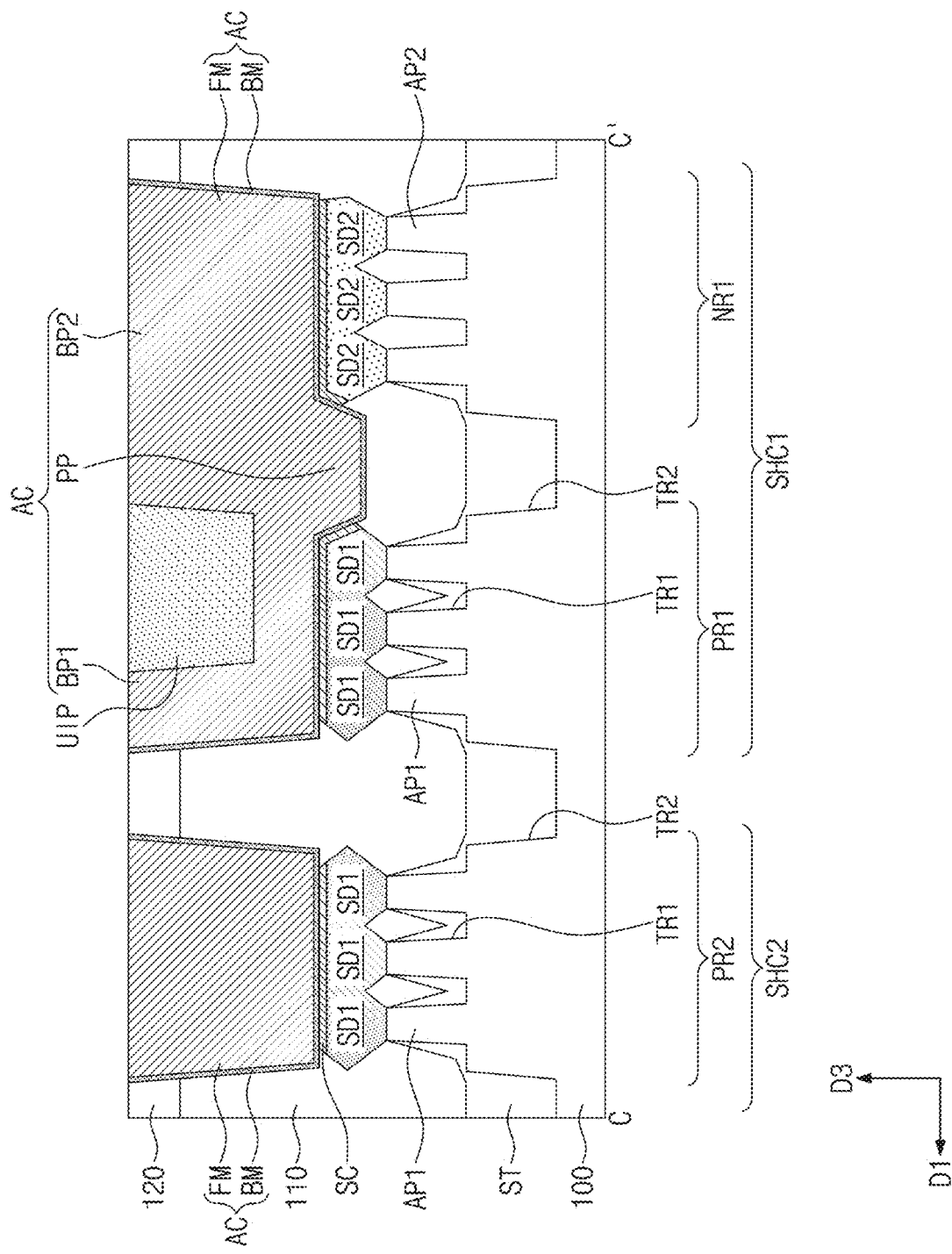
Figure 14D:
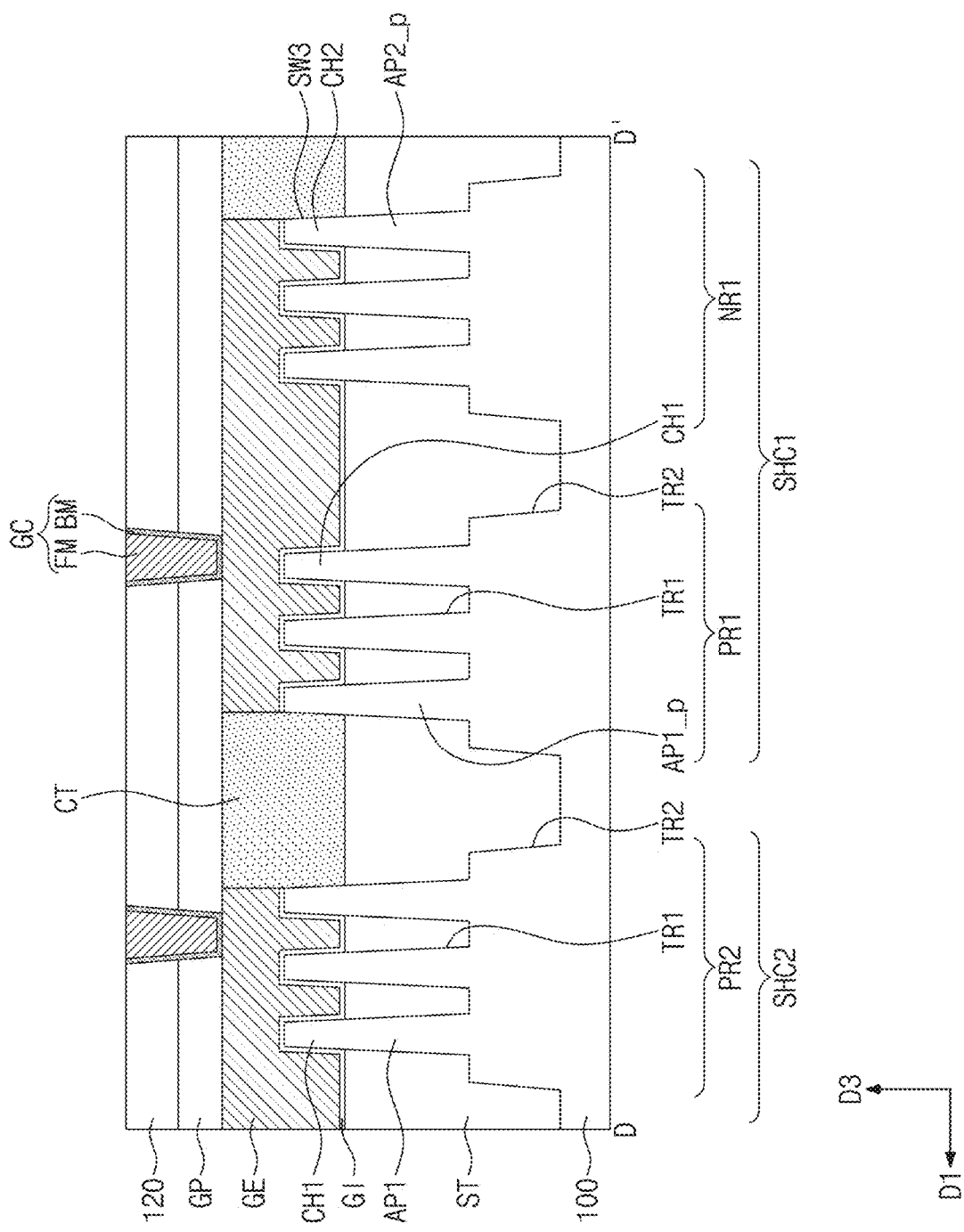

FIGS. 7, 9, 11, and 13 are plan views illustrating a method of fabricating a semiconductor device according to an embodiment of inventive concepts. FIGS. 8A, 10A, 12A, and 14A are sectional views taken along lines A-A' of FIGS. 7, 9, 11, and 13, respectively. FIGS. 8B, 10B, 12B, and 14B are sectional views taken along lines B-B' of FIGS. 7, 9, 11, and 13, respectively. FIGS. 10C, 12C, and 14C are sectional views taken along lines C-C' of FIGS. 7, 9, 11, and 13, respectively. FIGS. 8C, 10D, 12D, and 14D are sectional views taken along lines D-D' of FIGS. 7, 9, 11, and 13, respectively.

Referring to FIGS. 7 and 8A to 8C, the substrate 100 having the first PMOSFET region PR1, the second PMOSFET region PR2, the first NMOSFET region NR1, and the second NMOSFET region NR2 may be provided. The first NMOSFET region NR1 and the first PMOSFET region PR1 may define the first single height cell SHC1, and the second NMOSFET region NR2 and the second PMOSFET region PR2 may define the second single height cell SHC2.

The substrate 100 may be patterned to form the first and second active patterns AP1 and AP2. The first active patterns AP1 may be formed on each of the first and second PMOS- FET regions PR1 and PR2. The second active patterns AP2 may be formed on each of the first and second NMOSFET regions NR1 and NR2.

The device isolation layer ST may be formed on the substrate 100. The device isolation layer ST may be formed of or include at least one of insulating materials (e.g., silicon oxide). The device isolation layer ST may be recessed to expose an upper portion of each of the first and second active patterns AP1 and AP2. Thus, the upper portion of each of the first and second active patterns AP1 and AP2 may protrude vertically above the device isolation layer ST.

Sacrificial patterns SAP may be formed to cross the first and second active patterns AP1 and AP2. The sacrificial patterns SAP may be formed to have a line or bar shape extending in the first direction D1.

In detail, the formation of the sacrificial patterns SAP may include forming a sacrificial layer on the substrate 100, forming mask patterns MA on the sacrificial layer, and patterning the sacrificial layer using the mask patterns MA as an etch mask. The sacrificial layer may be formed of or include polysilicon.

In an embodiment, the patterning process to form the sacrificial patterns SAP may include a lithography process using an extreme ultraviolet (EUV) light. In the present specification, the EUV light may have a wavelength ranging from 4 nm and 124 nm and, in particular, from 4 nm and 20 nm and may be, for example, an ultraviolet light having a wavelength of 13.5 nm. The EUV light may have an energy of 6.21 eV to 124 eV, and, in particular, from 90 eV to 95 eV.

The lithography process using the EUV light may include performing an exposing process of irradiating the EUV light onto a photoresist layer and performing a developing process. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but inventive concepts are not limited to these examples.

The mask patterns MA may be formed by patterning at least one layer, which is disposed therebelow, using the photoresist patterns as an etch mask. Thereafter, desired patterns (e.g., the sacrificial patterns SAP) may be formed on a wafer by patterning a target layer (e.g., the sacrificial layer) using the mask patterns MA as an etch mask.

In a comparative example of inventive concepts, a multi-patterning technology (MPT) using two or more photomasks is required to form fine-pitch patterns on the wafer. By contrast, in the case where the EUV lithography process according to an embodiment of inventive concepts is performed, the sacrificial patterns SAP may be formed to have a fine pitch, using just one photomask.

For example, the minimum pitch between the sacrificial patterns SAP, which are realized by the EUV lithography process according to the present embodiment, may be less than or equal to 45 nm. In other words, the EUV lithography process may be performed to precisely and finely form the sacrificial patterns SAP, without a multi-patterning technology.

In an embodiment, the EUV lithography process may be used in the patterning process for forming not only the sacrificial patterns SAP but also the first and second active patterns AP1 and AP2 described above, but inventive concepts are not limited to this example.

A pair of the gate spacers GS may be formed on opposite side surfaces of each of the sacrificial patterns SAP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may be a multi-layered structure including at least two of SiCN, SiCON, or SiN.

Referring to FIGS. 9 and 10A to 10D, the first source/drain patterns SD1 may be formed on or in upper portions of each of the first active patterns AP1. A pair of the first source/drain patterns SD1 may be formed at both sides of each of the sacrificial patterns SAP.

Figure 8A:
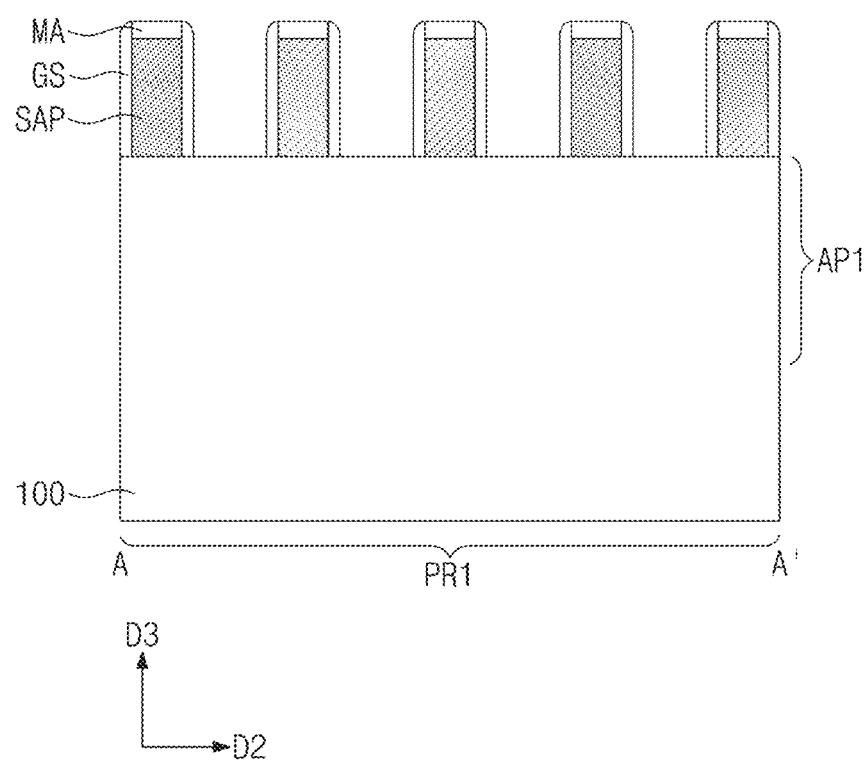
FIGS. 8A, 10A, 12A, and 14A are sectional views taken along lines A-A' of FIGS. 7, 9, 11, and 13, respectively.
Figure 8B:
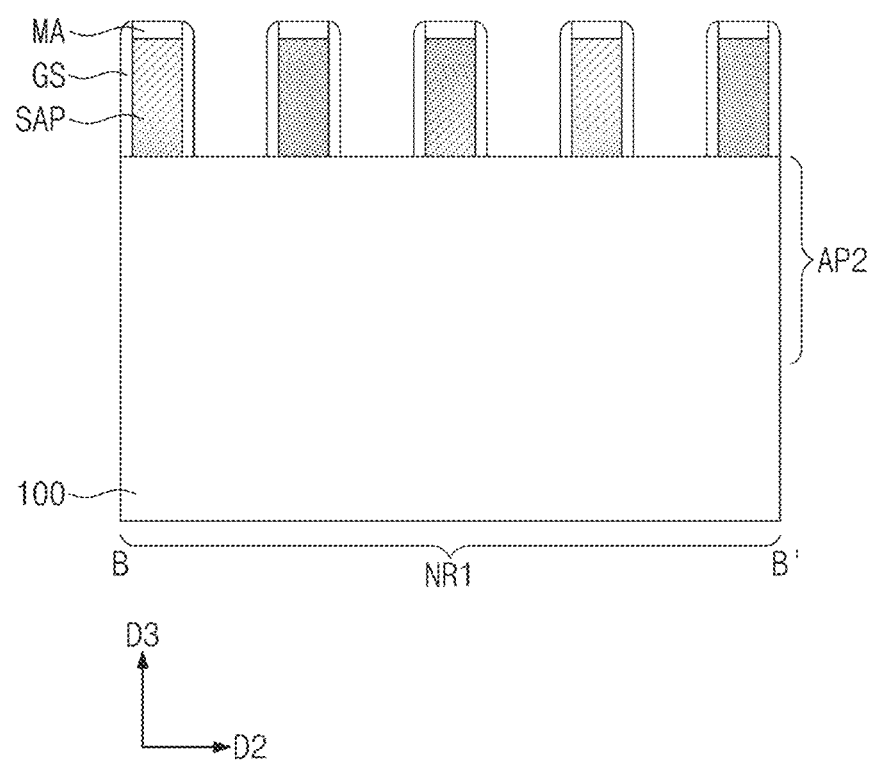
FIGS. 8B, 10B, 12B, and 14B are sectional views taken along lines B-B' of FIGS. 7, 9, 11, and 13, respectively.
Figure 8C:
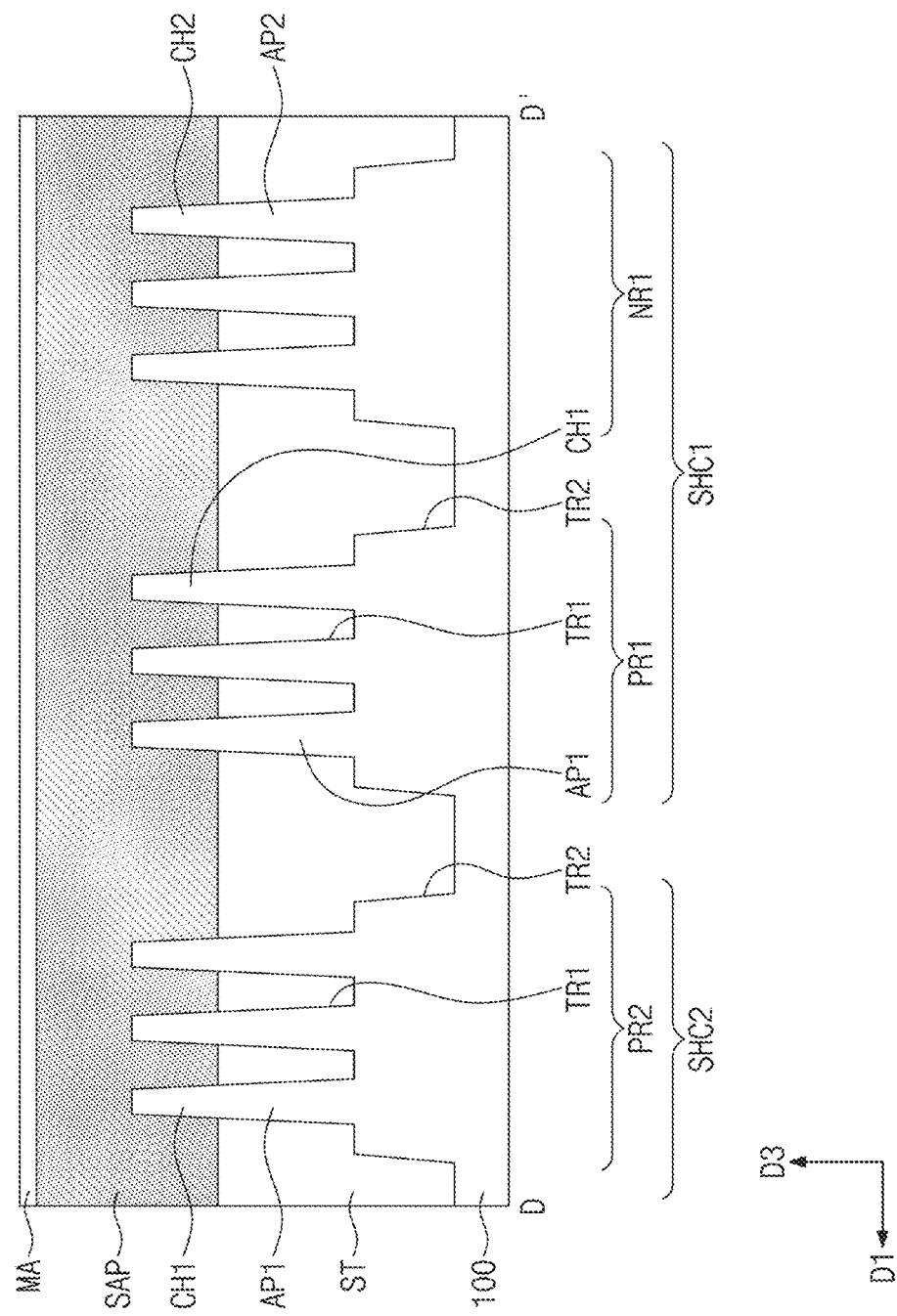
FIGS. 8C, 10D, 12D, and 14D are sectional views taken along lines D-D' of FIGS. 7, 9, 11, and 13, respectively.
Figure 9:
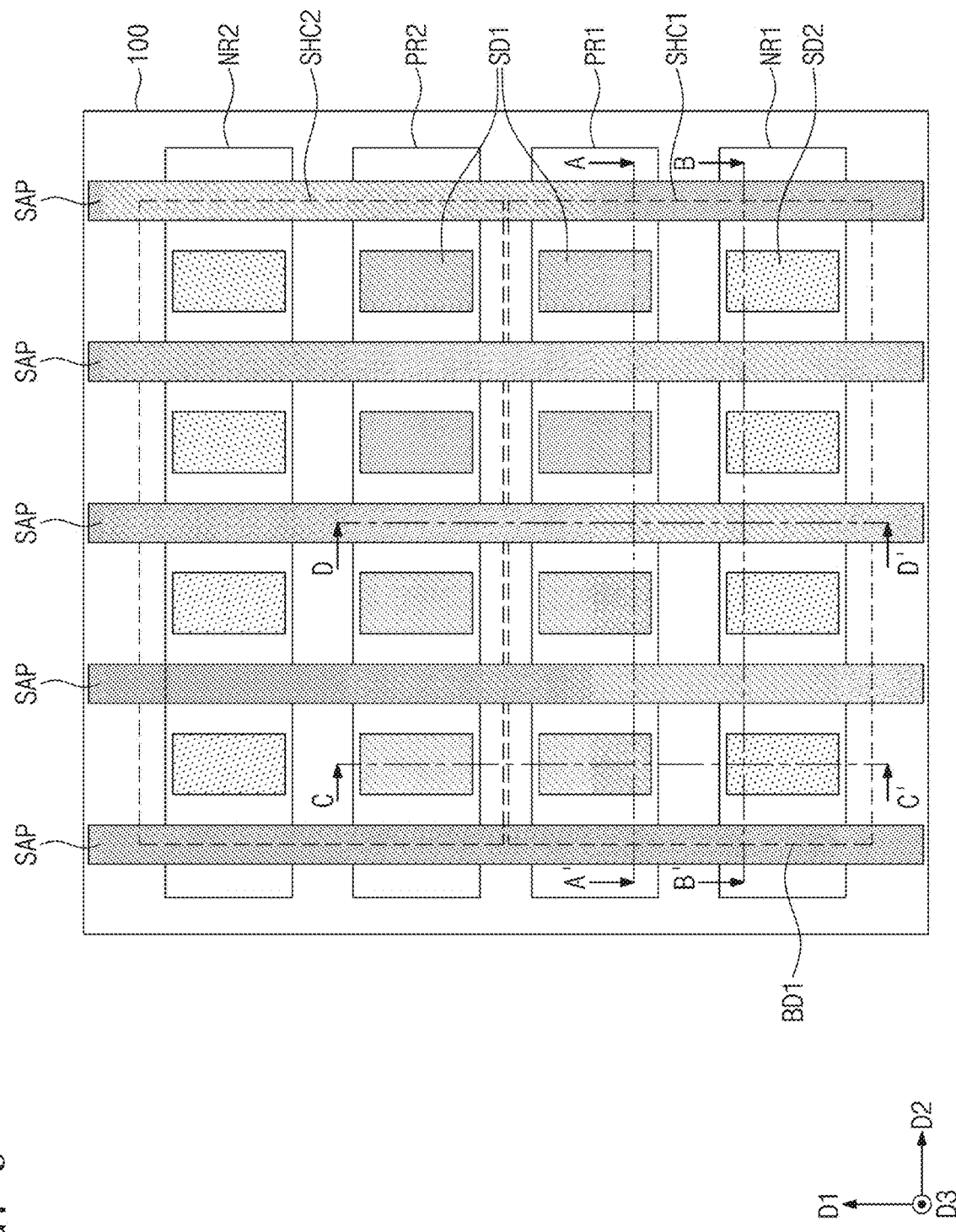

In detail, first recesses may be formed by etching the upper portion of the first active pattern AP1 using the mask patterns MA and the gate spacers GS as an etch mask. During the etching of the upper portion of the first active pattern AP1, the device isolation layer ST between the first active patterns AP1 may be recessed, as shown in FIG. 8C.

The first source/drain pattern SD1 may be formed by performing a selective epitaxial growth process using an inner surface of the first recess of the first active pattern AP1 as a seed layer. As a result of the formation of the first source/drain patterns SD1, the first channel pattern CH1 may be defined between each pair of the first source/drain patterns SD1. As an example, the selective epitaxial growth process may include a chemical vapor deposition (CVD) process or a molecular beam epitaxy (MBE) process. The first source/drain patterns SD1 may include a semiconductor material (e.g., SiGe) having a lattice constant greater than that of the substrate 100. Each of the first source/drain patterns SD1 may be a multi-layered structure including a plurality of semiconductor layers.

In an embodiment, the first source/drain patterns SD1 may be doped in an in-situ manner during a selective epitaxial growth process. In another embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be formed at both sides of each of the sacrificial patterns SAP.

In detail, second recesses may be formed by etching an upper portion of the second active pattern AP2 using the mask patterns MA and the gate spacers GS as an etch mask. The second source/drain pattern SD2 may be formed by performing a selective epitaxial growth process using an inner surface of the second recess of the second active pattern AP2 as a seed layer. As a result of the formation of the second source/drain patterns SD2, the second channel pattern CH2 may be defined between each pair of the second source/drain patterns SD2. As an example, the second source/drain patterns SD2 may be formed of or include the same semiconductor material (e.g., Si) as the substrate 100.

The second source/drain patterns SD2 may be doped to have a second conductivity type (e.g., n-type).

The first source/drain patterns SD1 and the second source/drain patterns SD2 may be sequentially formed through different processes. In other words, the first source/drain patterns SD1 and the second source/drain patterns SD2 may not be formed at the same time.

Referring to FIGS. 11 and 12A to 12D, the first interlayer insulating layer 110 may be formed to cover the first and second source/drain patterns SD1 and SD2, the mask patterns MA, and the gate spacers GS. In an embodiment, the first interlayer insulating layer 110 may be formed of or include silicon oxide.

The first interlayer insulating layer 110 may be planarized to expose the top surfaces of the sacrificial patterns SAP. The planarization of the first interlayered insulating layer 110 may be performed using an etch-back or chemical mechanical polishing (CMP) process. In an embodiment, the mask patterns MA may be fully removed during the planarization process. Accordingly, the first interlayer insulating layer 110 may have a top surface that is coplanar with the top surfaces of the sacrificial patterns SAP and the top surfaces of the gate spacers GS.

The sacrificial patterns SAP may be replaced with the gate electrodes GE, respectively. In detail, the sacrificial patterns SAP exposed may be selectively removed. Empty spaces may be formed as a result of the removal of the sacrificial patterns SAP. The gate insulating layer GI and the gate electrode GE may be formed in each of the empty spaces. The gate electrode GE may include a first metal pattern and a second metal pattern on the first metal pattern. The first metal pattern may be formed of a work function metal, which is used to adjust a threshold voltage of a transistor, and the second metal pattern may be formed of a metallic material having a low resistance.

After the replacing of the sacrificial pattern SAP with the gate electrode GE, the gate electrode GE may be patterned to form the gate cutting patterns CT. The gate cutting patterns CT may be formed to divide each gate electrode GE into a plurality of gate electrodes GE.

In detail, a photolithography process may be performed to form a mask layer with openings, and here, the openings may be used to define positions and shapes of the gate cutting patterns CT. Portions of the gate electrodes GE exposed by the openings may be selectively removed using an etching process. The gate insulating layer GI may also be removed when the portions of the gate electrodes GE are removed. The gate cutting patterns CT may be formed by filling empty regions, which are formed by removing the gate electrodes GE, with an insulating material. As previously described with reference to FIG. 5D, the gate cutting patterns CT may be formed to be in contact with the side surface SW3 of the first outermost active pattern AP1_p and the side surface SW3 of the second outermost active pattern AP2_p.

The gate capping pattern GP may be formed on the gate electrodes GE and the gate cutting patterns CT.

Referring to FIGS. 13 and 14A to 14D, the second interlayer insulating layer 120 may be formed on the first interlayer insulating layer 110. The second interlayer insulating layer 120 may include a silicon oxide layer. A pair of the division structures DB may be respectively formed at both sides of the first single height cell SHC1. The division structures DB may be overlapped with the gate electrodes GE, which are respectively formed at both sides of the first single height cell SHC1. For example, the formation of the division structures DB may include forming a hole to penetrate the first and second interlayer insulating layers 110 and 120 and the gate electrode GE and to extend into the first and second active patterns AP1 and AP2 and then filling the hole with an insulating layer.

The active contacts AC may be formed to penetrate the second interlayer insulating layer 120 and the first interlayer insulating layer 110 and to be electrically connected to the first and second source/drain patterns SD1 and SD2. The upper insulating pattern UIP may be formed by replacing an upper portion of each of the active contacts AC with an insulating material. The gate contact GC may be formed to penetrate the second interlayer insulating layer 120 and the gate capping pattern GP and to be electrically connected to the gate electrode GE.

The third interlayer insulating layer 130 may be formed on the second interlayer insulating layer 120. The first metal layer M1 may be formed in the third interlayer insulating layer 130. The formation of the first metal layer M1 may include forming the first power line M1_R1, the second power line M1_R2, the third power line M1_R3, and the first interconnection lines M1_I.

The fourth interlayer insulating layer 140 may be formed on the first metal layer M1. The second metal layer M2 may be formed in the fourth interlayer insulating layer 140. The formation of the second metal layer M2 may include forming the second interconnection lines M2_I. As an example, the second interconnection lines M2_I may be formed by a dual damascene process.

In an embodiment, the formation of the interconnection lines in the first metal layer M1 and/or the second metal layer M2 may include a lithography process using an EUV light. The EUV lithography for the process of forming the interconnection lines (e.g., a BEOL process) may be performed in substantially the same manner as the formation of the sacrificial patterns SAP. For example, the minimum pitch between the first interconnection lines M1_I, which are realized by the EUV lithography process according to the present embodiment, may be less than or equal to 45 nm.

Figure 15:
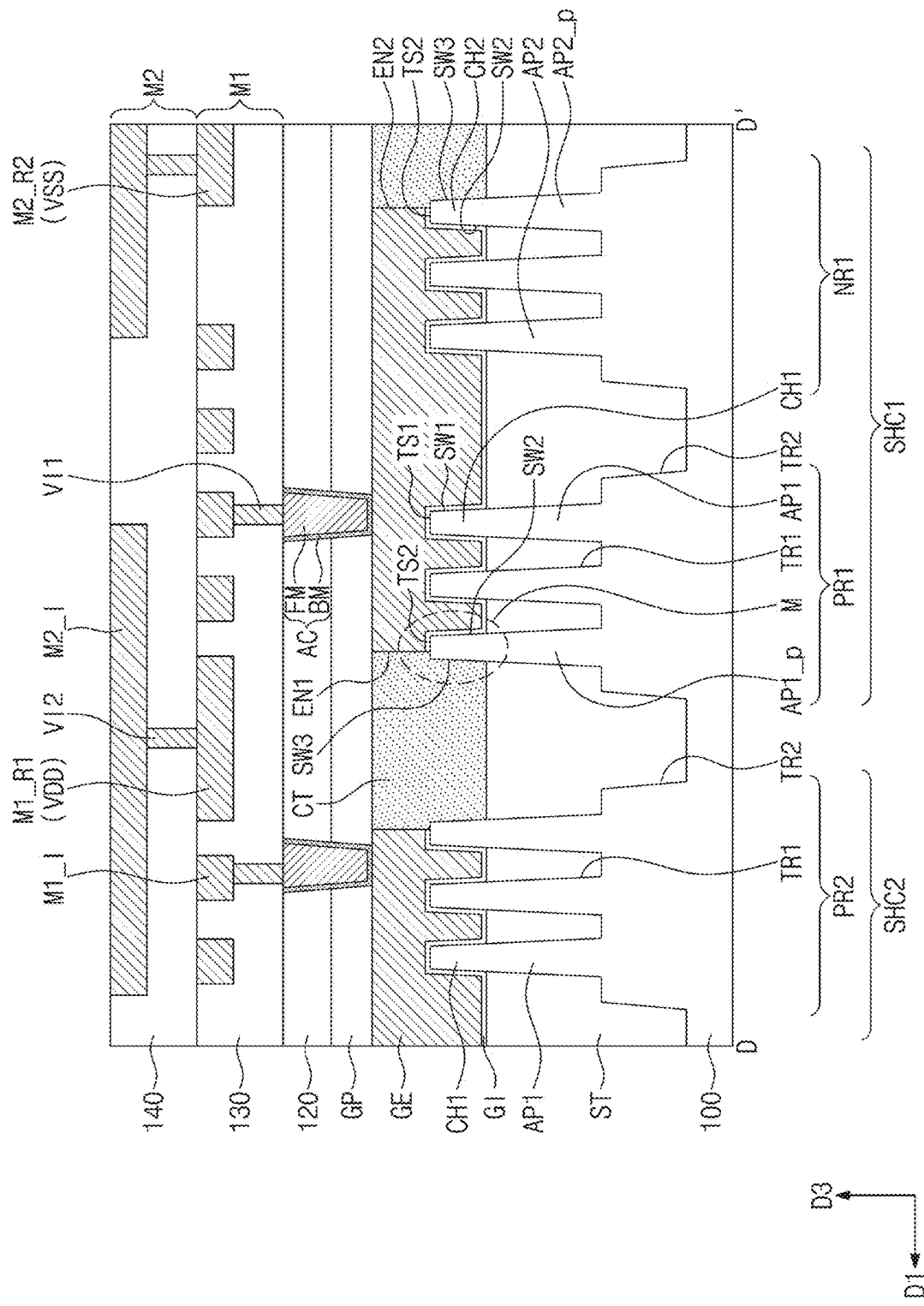
FIG. 15 is a sectional view, which is taken along a line D-D' of FIG. 4 to illustrate a semiconductor device according to an embodiment of inventive concepts.
Figure 16:
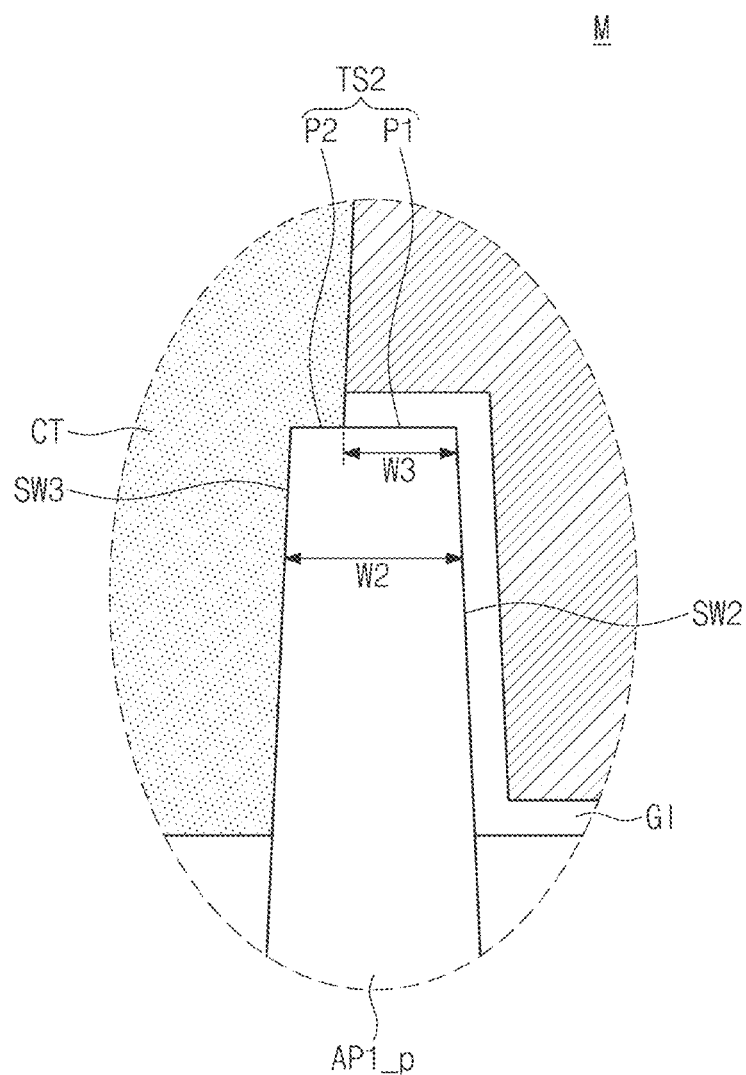
FIG. 16 is an enlarged sectional view illustrating a portion M of FIG. 15.

FIG. 15 is a sectional view, which is taken along a line D-D' of FIG. 4 to illustrate a semiconductor device according to an embodiment of inventive concepts. FIG. 16 is an enlarged sectional view illustrating a portion M of FIG. 15. In the following description, an element previously described with reference to FIGS. 4 and 5A to 5D may be identified by the same reference number without repeating an overlapping description thereof.

Referring to FIGS. 4, 15, and 16, the first end EN1 of the gate electrode GE may be located on the second top surface TS2 of the first outermost active pattern AP1_p. The second end EN2 of the gate electrode GE may be located on the second top surface TS2 of the second outermost active pattern AP2_p. The gate electrode GE may partially cover the second top surface TS2 of the first outermost active pattern AP1_p.

In detail, the second top surface TS2 of the first outermost active pattern AP1_p may include a first region P1 that is vertically overlapped with the gate electrode GE. The remaining region of the second top surface TS2 (hereinafter, a second region P2), except the first region P1, may not be vertically overlapped with the gate electrode GE. The second region P2 of the second top surface TS2 may be in contact with the gate cutting pattern CT.

An upper portion of the first outermost active pattern AP1_p may have a second width W2. The second width W2 may be small enough so that the device exhibits substantially the same physical characteristics as the fully-depleted device, as described above. For example, the second width W2 may range from 1 nm to 30 nm. The first region P1 of the second top surface TS2 may have a third width W3. The third width W3 may be smaller than the second width W2. A ratio of the third width W3 to the second width W2 may range from 0.1 to 0.9.

In an embodiment, although not shown, the gate electrode GE may cover the second side surface SW2 of the first outermost active pattern AP1_p but not the second top surface TS2 of the first outermost active pattern AP1_p. That is, the entirety of the second top surface TS2 may be covered with the gate cutting pattern CT, and in this case, the third width W3 may be substantially zero.

Even when the second top surface TS2 is completely covered with the gate cutting pattern CT, the semiconductor device according to the present embodiment may be operated as a normal device by the gate electrode GE on the second side surface SW2, because it behaves like the fully-depleted device.

Meanwhile, in the case where, like the present embodiment, the gate electrode GE is configured to partially cover or not cover the second top surface TS2 of the first outermost active pattern AP1_p, the length of the gate electrode GE in the first direction D1 may be further reduced. As a result, it may be possible to further reduce the cell height and to increase the integration density of the semiconductor device.

FIGS. 17, 18, 19, and 20 are sectional views, each of which is taken along a line D-D' of FIG. 4 to illustrate a semiconductor device according to an embodiment of inventive concepts. In the following description, an element previously described with reference to FIGS. 4 and 5A to 5D may be identified by the same reference number without repeating an overlapping description thereof.

Figure 17:
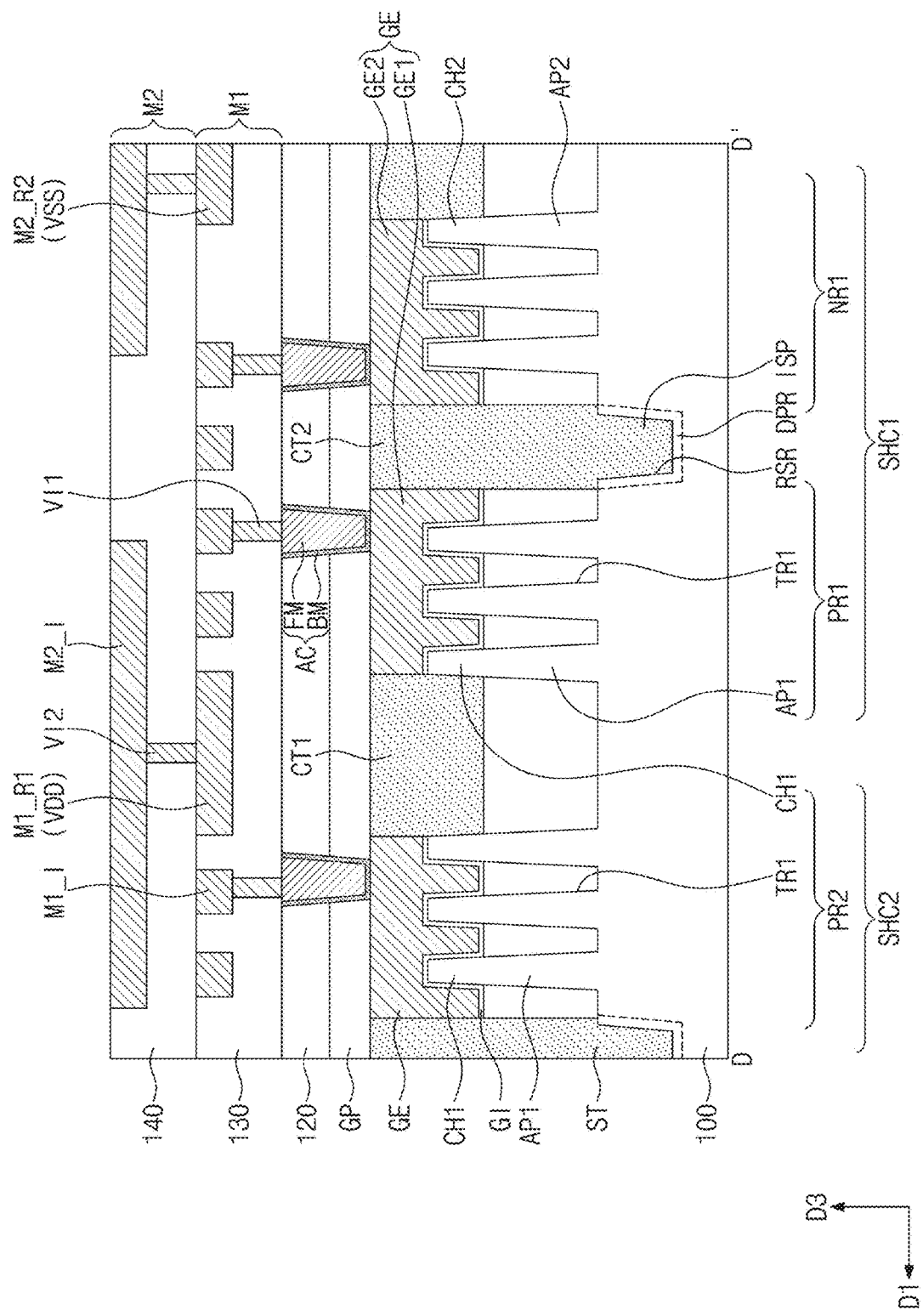
FIGS. 17, 18, 19, and 20 are sectional views, each of which is taken along a line D-D' of FIG. 4 to illustrate a semiconductor device according to an embodiment of inventive concepts.

Referring first to FIG. 17, the gate electrode GE on the first single height cell SHC1 may include a first gate electrode GE1 on the first active patterns AP1 and a second gate electrode GE2 on the second active patterns AP2.

The gate cutting patterns CT may include a first gate cutting pattern CT1 and a second gate cutting pattern CT2. The first gate cutting pattern CT1 may be provided between adjacent ones of the cells. The second gate cutting pattern CT2 may be provided to penetrate the gate electrode GE between the first PMOSFET and NMOSFET regions PR1 and NR1 and thereby to divide the gate electrode GE into the first and second gate electrodes GE1 and GE2.

The second gate cutting pattern CT2 may be extended toward the substrate 100 to fill a recess region RSR, which is formed in an upper portion of the substrate 100. The second gate cutting pattern CT2 may include an isolation pattern ISP, which is provided to fill the recess region RSR between the first PMOSFET and NMOSFET regions PR1 and NR1. The substrate 100 may include an impurity region DPR, which is formed along the recess region RSR. The impurity region DPR may be formed by an ion implantation process. The impurity region DPR and the isolation pattern ISP filling the recess region RSR may electrically disconnect the first PMOSFET and NMOSFET regions PR1 and NR1 from each other.

Due to the impurity region DPR and the isolation pattern ISP filling the recess region RSR, it may be possible to effectively prevent carriers from being conducted between the first PMOSFET and NMOSFET regions PR1 and NR1, even when a distance between the first PMOSFET and NMOSFET regions PR1 and NR1 is reduced. As a result, in the present embodiment, it may be possible to further reduce the distance between the first PMOSFET and NMOSFET regions PR1 and NR1 and thereby to further reduce the cell height.

Furthermore, according to the present embodiment, since the gate electrode GE is divided into the first and second gate electrodes GE1 and GE2, it may be possible to reduce parasitic capacitance, which is produced near the gate electrode GE. Accordingly, it may be possible to improve electric characteristics of the semiconductor device according to the present embodiment.

Figure 18:
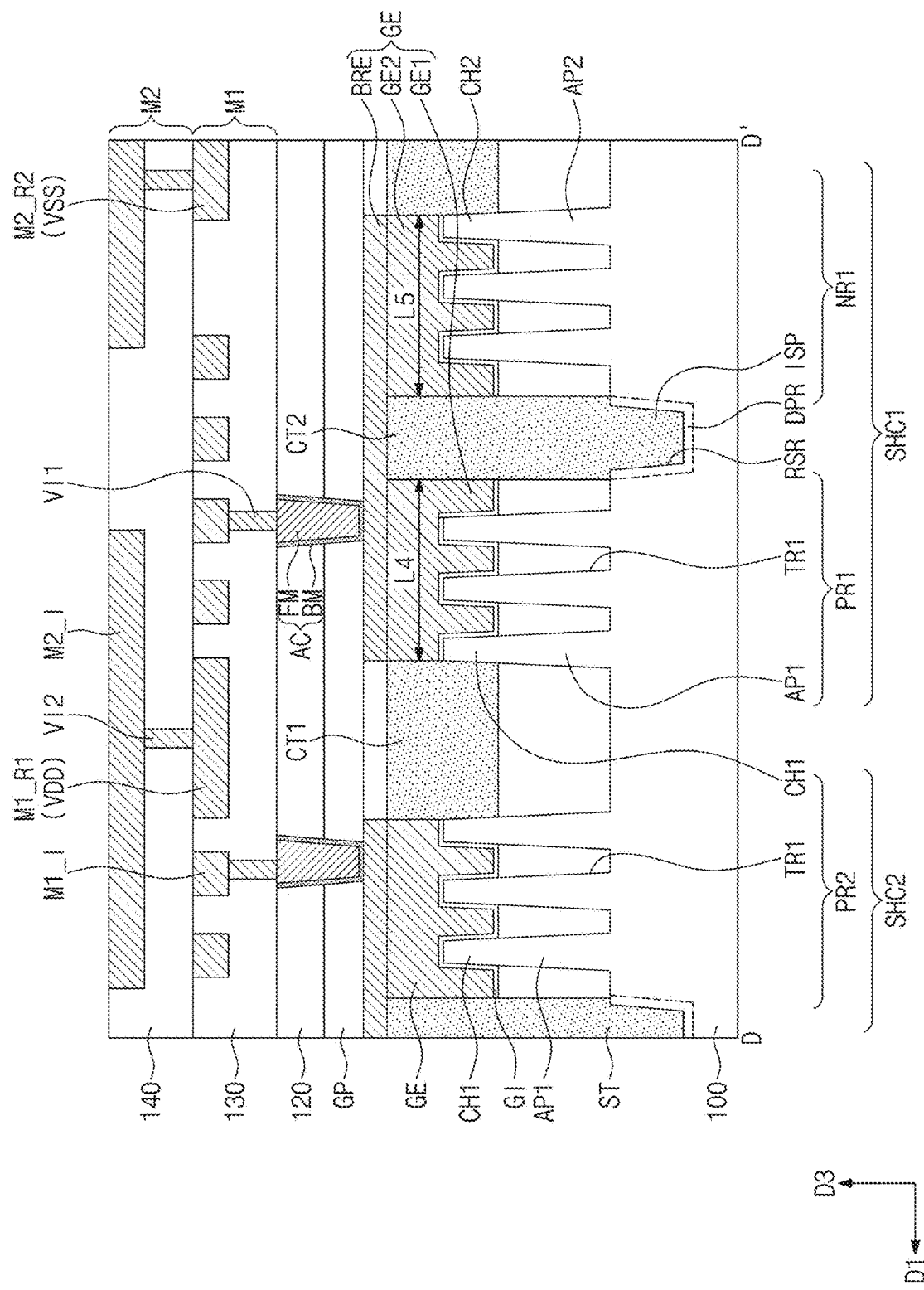

Referring to FIG. 18, a bridge electrode BRE may be provided on the first and second gate electrodes GE1 and GE2 of FIG. 17. The bridge electrode BRE may electrically connect the first and second gate electrodes GE1 and GE2 to each other. The gate contact GC may be connected to the bridge electrode BRE.

In the present embodiment, the first gate electrode GE1 may have a fourth length L4, and the second gate electrode GE2 may have a fifth length L5. The fourth length L4 may be different from the fifth length L5. For example, the fourth length L4 may be larger than the fifth length L5.

Figure 19:
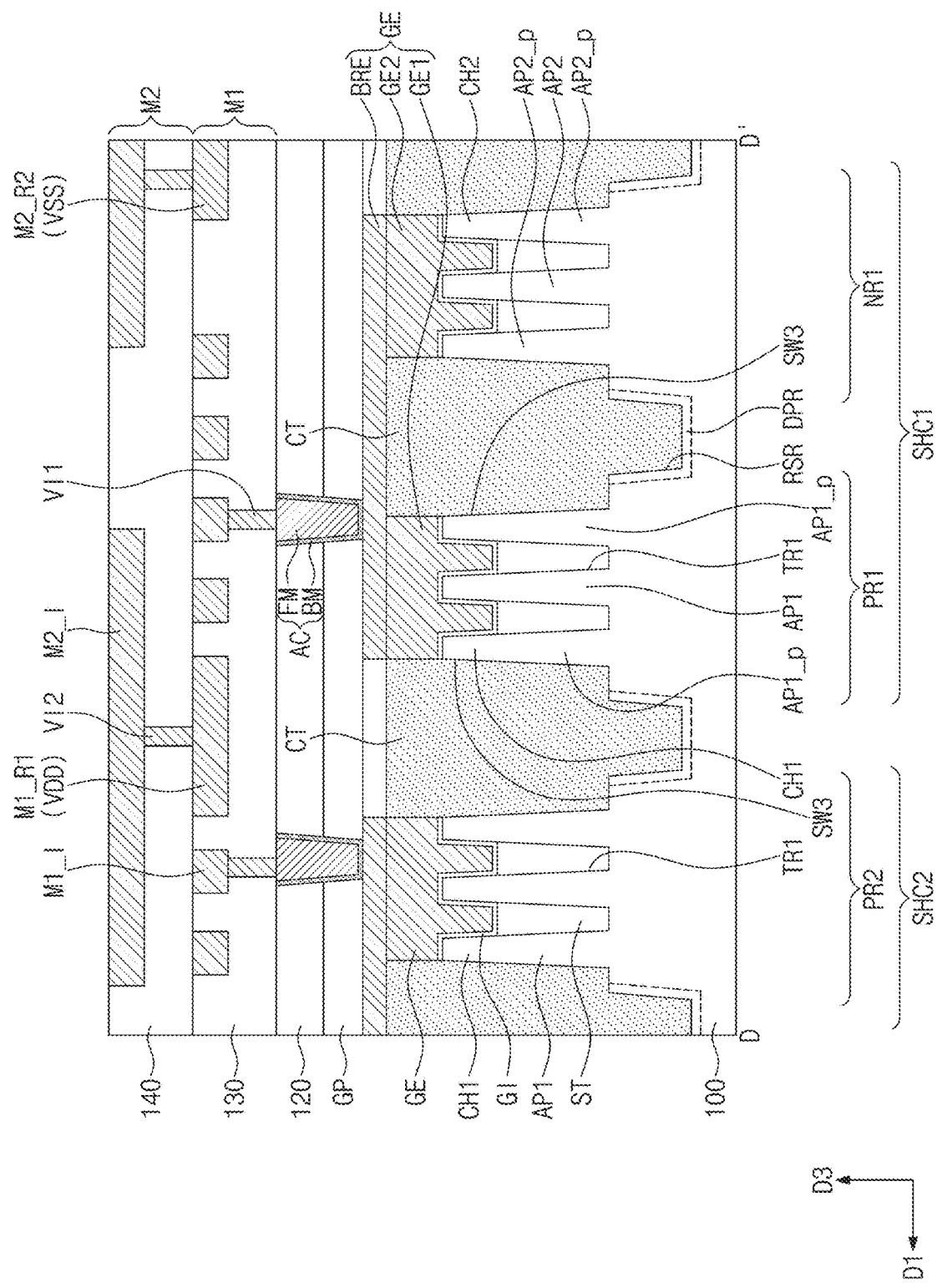

Referring to FIG. 19, the first active patterns AP1 may include a pair of the first outermost active patterns AP1_p. The first gate electrode GE1 may not cover the side surface SW3 of each of the first outermost active patterns AP1_p. The side surface SW3 of each of the pair of the first outermost active patterns AP1_p may be covered with the gate cutting pattern CT. The second active patterns AP2 may include a pair of second outermost active patterns AP2_p. The second gate electrode GE2 may not cover the side surface of each of the second outermost active patterns AP2_p.

In the present embodiment, the first and second gate electrodes GE1 and GE2 may be respectively shorter than the first and second gate electrodes GE1 and GE2 of FIG. 18. Since each of the first and second gate electrodes GE1 and GE2 in the present embodiment has a reduced size compared with that of FIG. 18, it may be possible to more effectively reduce the parasitic capacitance, which is produced near the gate electrode GE. Accordingly, the electric characteristics of the semiconductor device may be improved.

Figure 20:
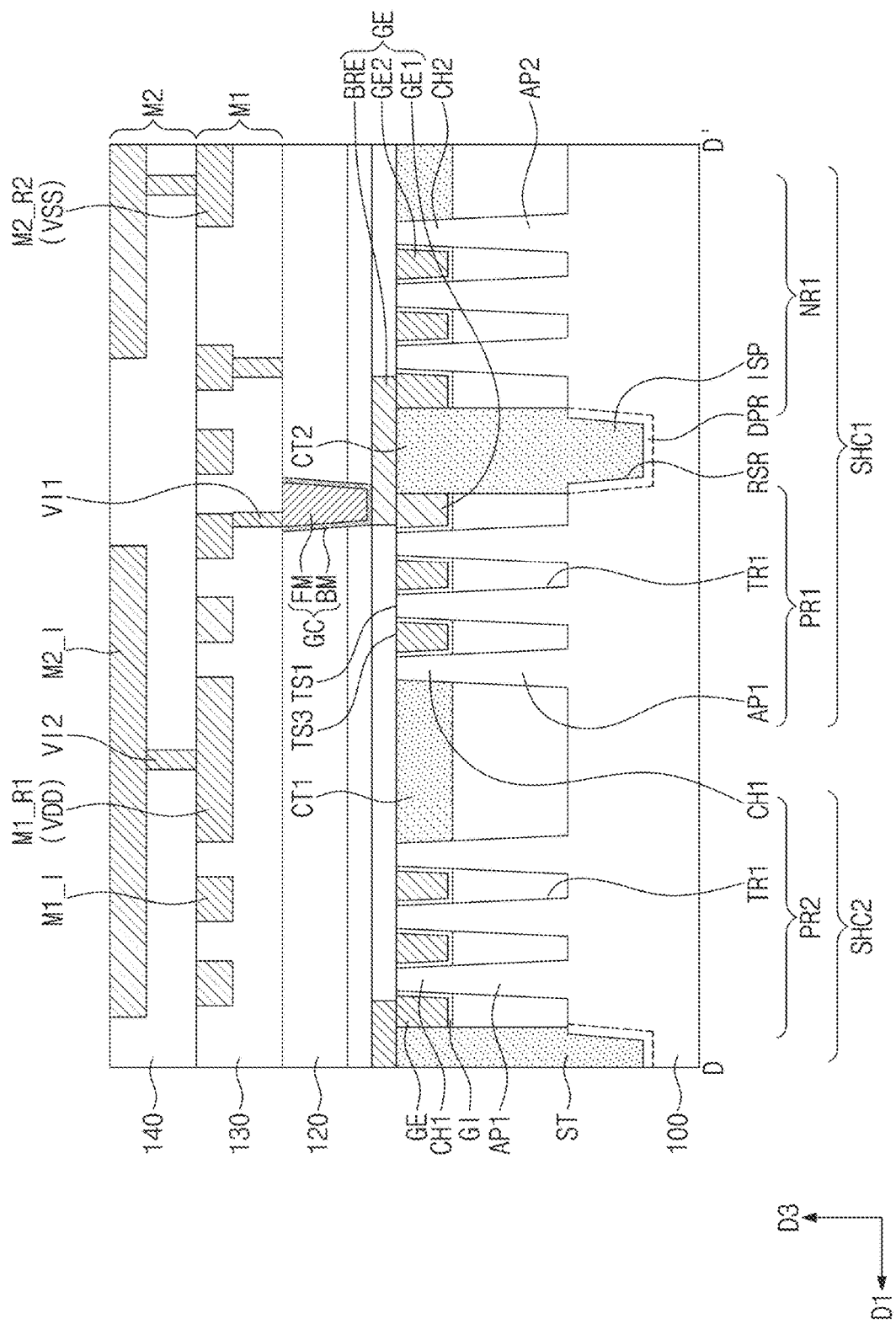

Referring to FIG. 20, each of the first active patterns AP1 may have the first top surface TS1. The first gate electrode GE1 may have a third top surface TS3. The third top surface TS3 may be located at a level that is the same as or lower than the first top surface TS1. The top surface of the second gate electrode GE2 may also be coplanar with or lower than the top surface of each of the second active patterns AP2.

In the present embodiment, the first and second gate electrodes GE1 and GE2 may be respectively smaller than the first and second gate electrodes GE1 and GE2 of FIG. 19. Since each of the first and second gate electrodes GE1 and GE2 in the present embodiment has a reduced size compared with that of FIG. 19, it may be possible to more effectively reduce the parasitic capacitance, which is produced near the gate electrode GE.

FIGS. 21A to 21D are sectional views, which are respectively taken along lines A-A', B-B', C-C', and D-D' of FIG. 4 to illustrate a semiconductor device according to an embodiment of inventive concepts. In the following description, an element previously described with reference to FIGS. 4 and 5A to 5D may be identified by the same reference number without repeating an overlapping description thereof.

Referring to FIGS. 4 and 21A to 21D, the substrate 100 including the first PMOSFET region PR1, the second PMOSFET region PR2, the first NMOSFET region NR1, and the second NMOSFET region NR2 may be provided. The device isolation layer ST may be provided on the substrate 100. The device isolation layer ST may define the first active pattern AP1 and the second active pattern AP2 in an upper portion of the substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

The first active pattern AP1 may include the first channel pattern CH1 provided at an upper portion thereof. The second active pattern AP2 may include the second channel pattern CH2 provided at an upper portion thereof. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include at least one of silicon (Si), germanium (Ge), or silicon-germanium (SiGe). In an embodiment, each of the first to third semiconductor patterns SP1, SP2, and SP3 may be formed of or include crystalline silicon.

The first active pattern AP1 may further include the first source/drain patterns SD1. The stacked first to third semiconductor patterns SP1, SP2, and SP3 of the first channel pattern CH1 may be interposed between each adjacent pair of the first source/drain patterns SD1. The stacked first to third semiconductor patterns SP1, SP2, and SP3 may connect each adjacent pair of the first source/drain patterns SD1 to each other.

The second active pattern AP2 may further include the second source/drain patterns SD2. The stacked first to third semiconductor patterns SP1, SP2, and SP3 of the second channel pattern CH2 may be interposed between each adjacent pair of the second source/drain patterns SD2. The stacked first to third semiconductor patterns SP1, SP2, and SP3 may connect each adjacent pair of the second source/drain patterns SD2 to each other.

The gate electrodes GE may be provided to cross the first and second channel patterns CH1 and CH2 and to extend in the first direction D1. The gate electrode GE may be vertically overlapped with the first and second channel patterns CH1 and CH2. A pair of the gate spacers GS may be disposed on opposite side surfaces of the gate electrode GE. The gate capping pattern GP may be provided on the gate electrode GE.

Referring back to FIG. 21D, the gate electrode GE may be provided to surround the first to third semiconductor patterns SP1, SP2, and SP3 of each of the first and second channel patterns CH1 and CH2. The transistor according to the present embodiment may be a three-dimensional field effect transistor (e.g., MBCFET or GAAFET) in which the gate electrode GE is provided to three-dimensionally surround the channel pattern CH1 or CH2. In detail, each of the first to third semiconductor patterns SP1, SP2, and SP3 may include a fourth top surface TS4, a fourth side surface SW4, a fifth side surface SW5 opposite to the fourth side surface SW4, and a bottom surface BS. The fifth side surface SW5 may be the outermost side surface of the semiconductor pattern. The gate electrode GE may cover the fourth top surface TS4, the fourth side surface SW4, and the bottom surface BS. The gate electrode GE may not cover the fifth side surface SW5 and may cover the fifth side surface SW5. The fifth side surface SW5 may be covered with the gate cutting pattern CT.

Figure 21A:
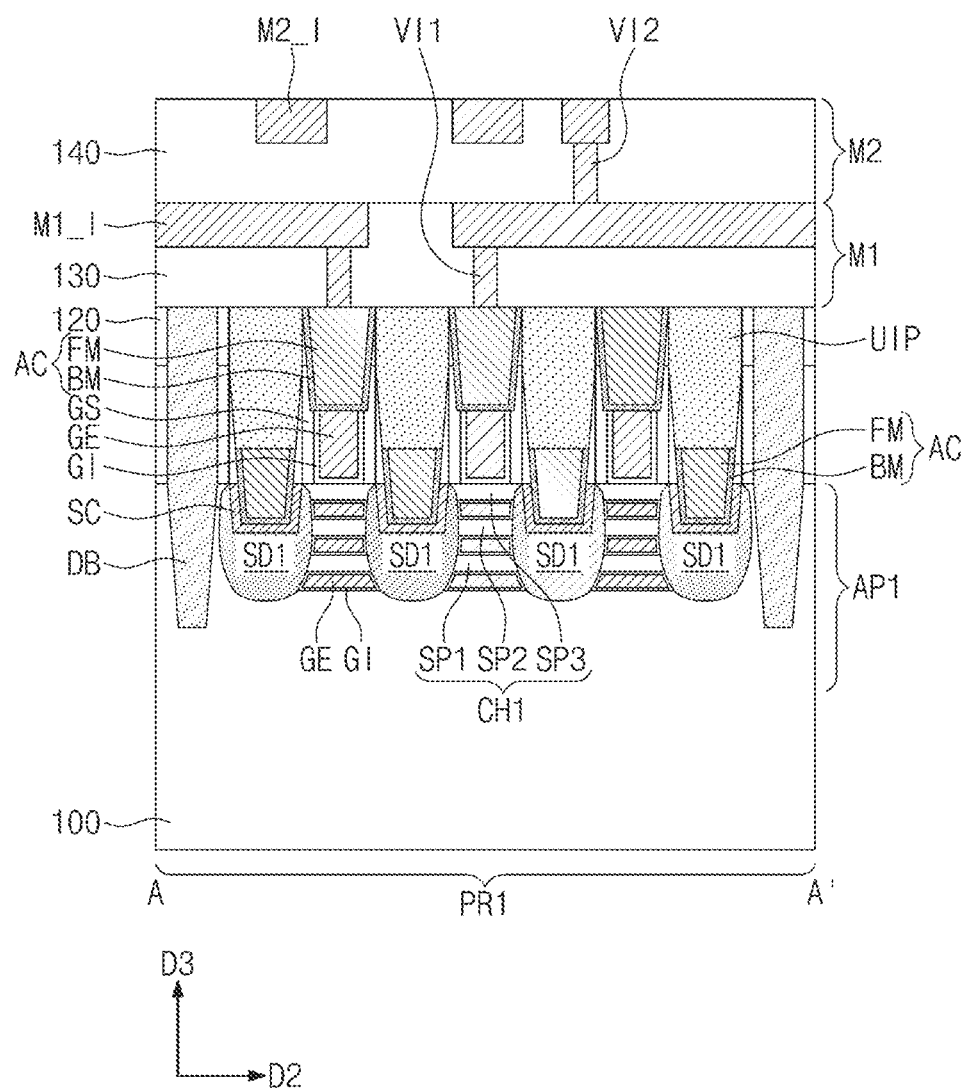
FIGS. 21A to 21D are sectional views, which are respectively taken along lines A-A', B-B', C-C', and D-D' of FIG. 4 to illustrate a semiconductor device according to an embodiment of inventive concepts.
Figure 21B:
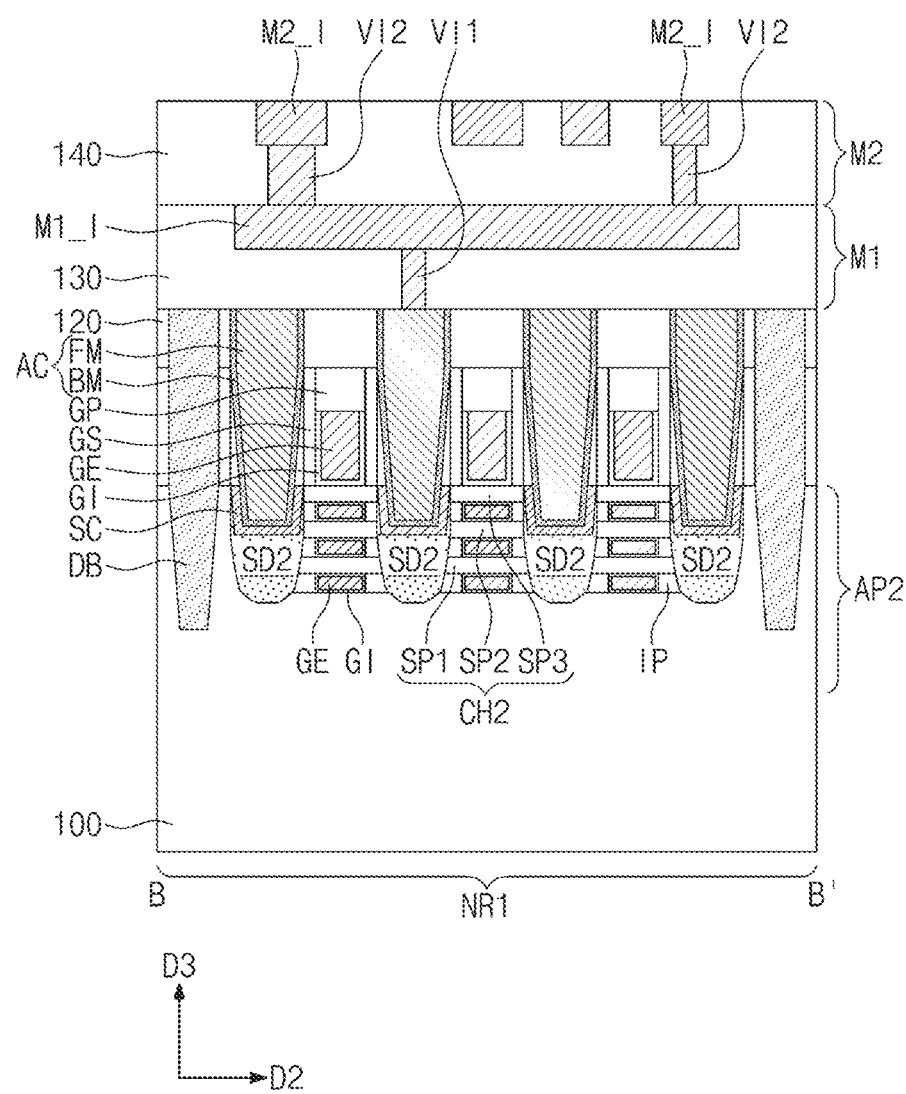
Figure 21C:
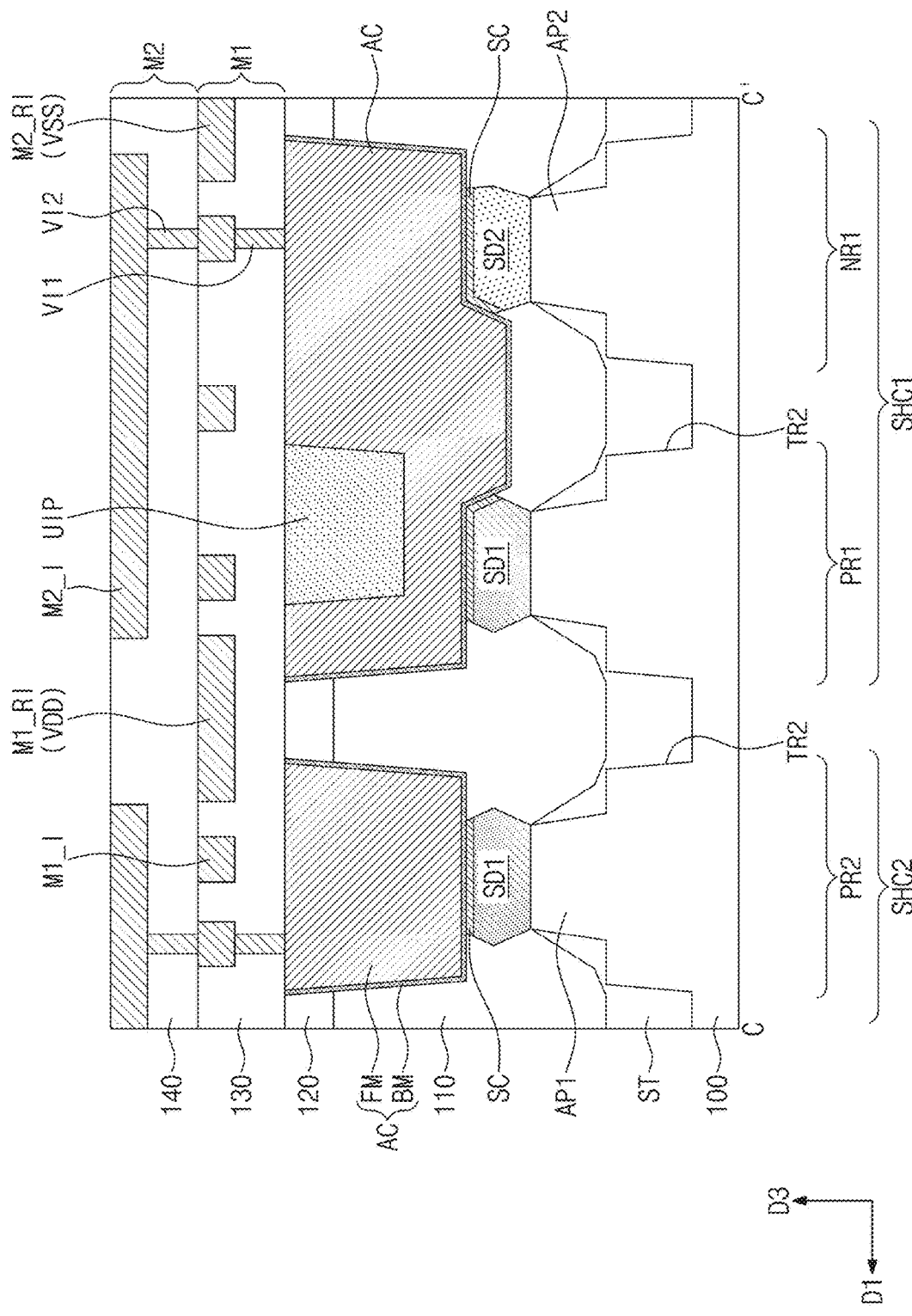
Figure 21D:
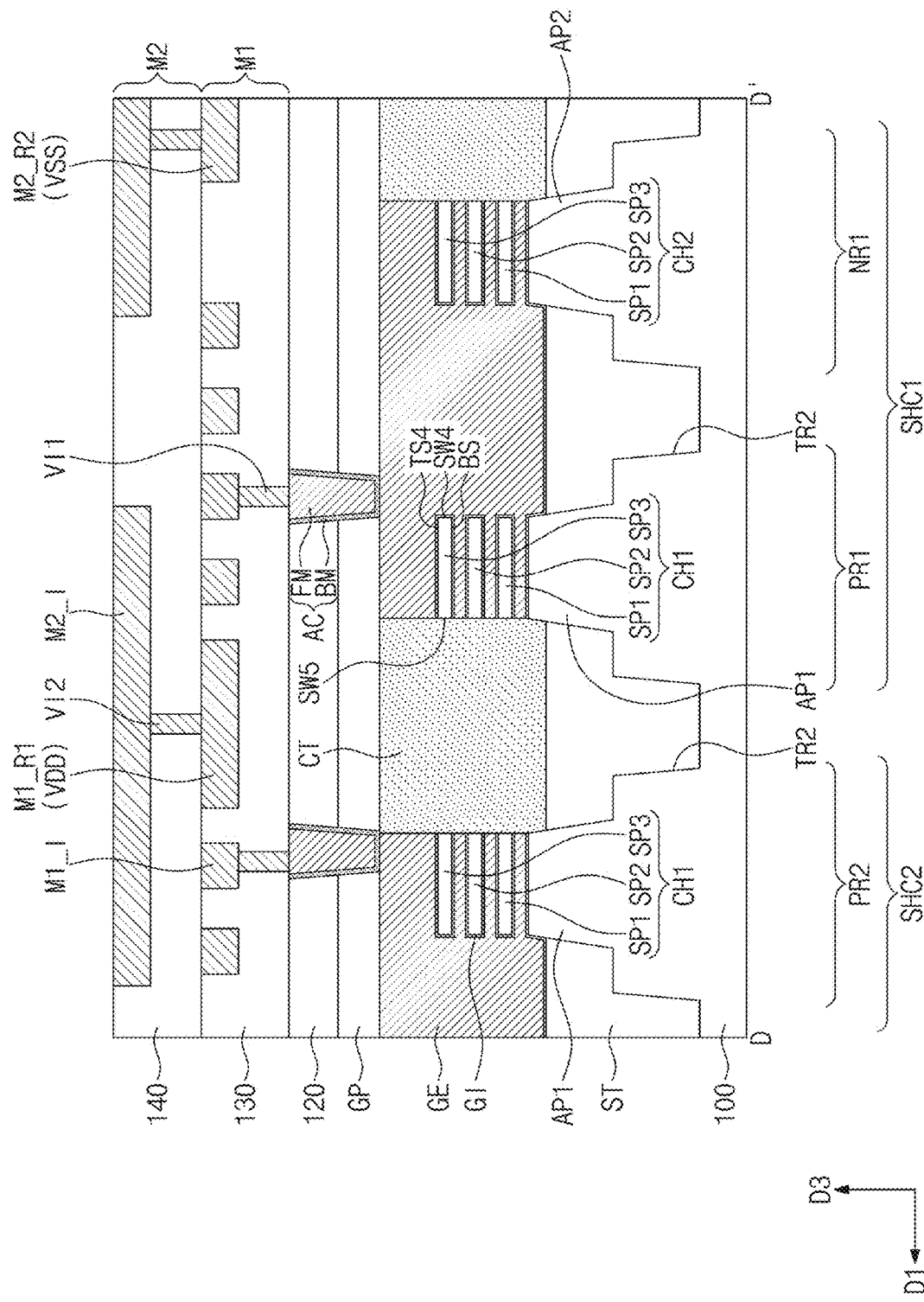

In the present embodiment, since the gate electrode GE does not cover the fifth side surface SW5 of each of the first to third semiconductor patterns SP1, SP2, and SP3, the gate electrode GE may have a length that is relatively small. In the present embodiment, since each of the first to third semiconductor patterns SP1, SP2, and SP3 has a thin body structure, the semiconductor device according to the present embodiment may behave like the fully-depleted device. Even when, as shown in FIG. 21D, the gate electrode GE does not cover the outermost side surface SW5 of the semiconductor pattern, the device may be normally operated.

The gate insulating layer GI may be provided between each of the first to third semiconductor patterns SP1, SP2, and SP3 and the gate electrode GE. The gate insulating layer GI may be provided to surround each of the first and second channel patterns CH1 and CH2.

An inner spacer IP, which is interposed between the gate insulating layer GI and the second source/drain pattern SD2, may be provided on each of the first and second NMOSFET regions NR1 and NR2. The gate electrode GE may be spaced apart from the second source/drain pattern SD2 by the gate insulating layer GI and the inner spacer IP. By contrast, the inner spacer IP may be omitted on the first and second PMOSFET regions PR1 and PR2.

The first interlayer insulating layer 110 and the second interlayer insulating layer 120 may be provided on the substrate 100. The active contacts AC may be provided to penetrate the first and second interlayer insulating layers 110 and 120 and may be connected to the first and second source/drain patterns SD1 and SD2, respectively. The gate contacts GC may be provided to penetrate the second interlayer insulating layer 120 and the gate capping pattern GP and may be respectively connected to the gate electrodes GE. The active and gate contacts AC and GC may be configured to have substantially the same features as those in the embodiments previously described with reference to FIGS. 4 and 5A to 5D.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be configured to have substantially the same features as those in the embodiments previously described with reference to FIGS. 4 and 5A to 5D.

Figure 22:
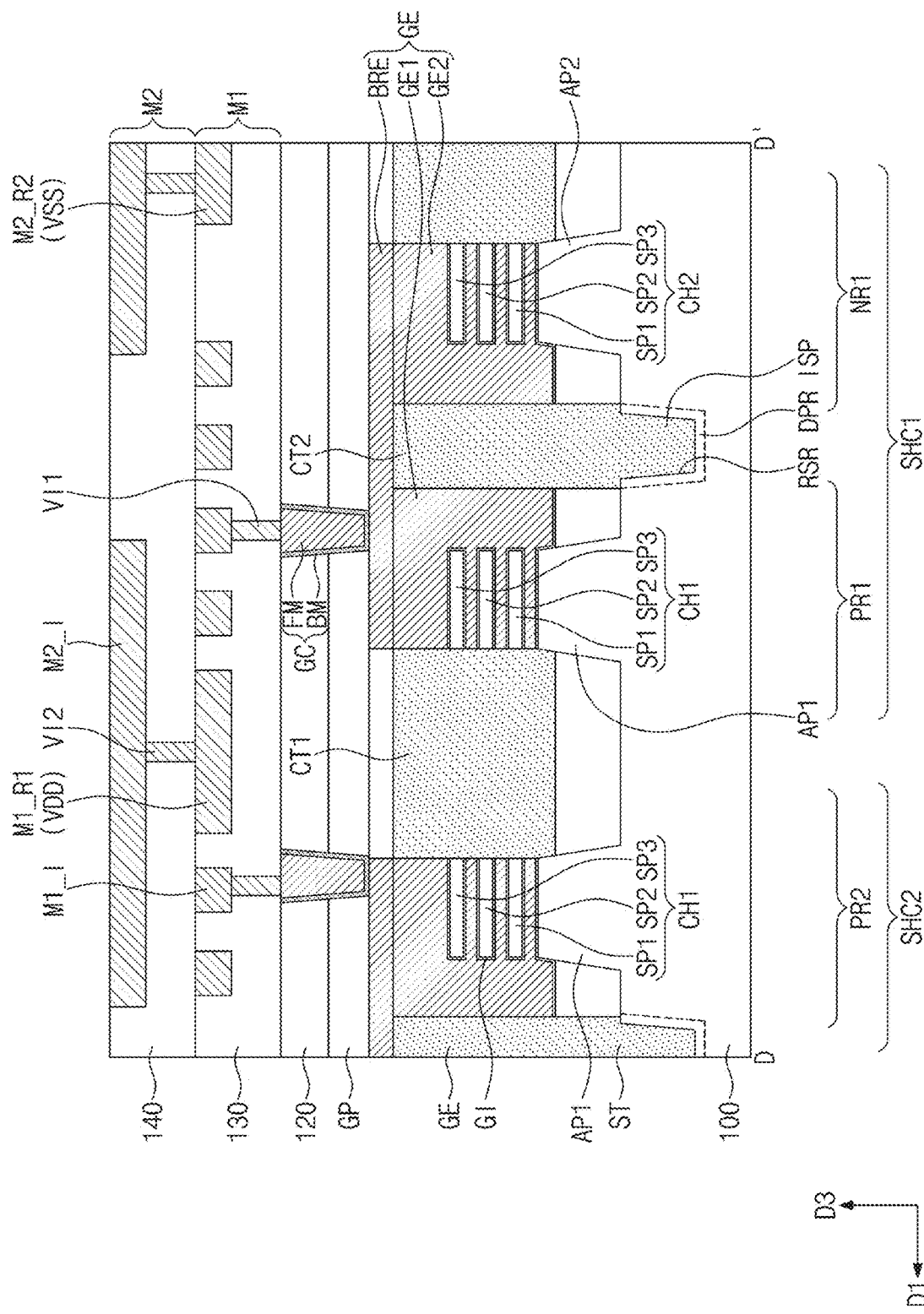
FIGS. 22 and 23 are sectional views, each of which is taken along a line D-D' of FIG. 4 to illustrate a semiconductor device according to an embodiment of inventive concepts.
Figure 23:
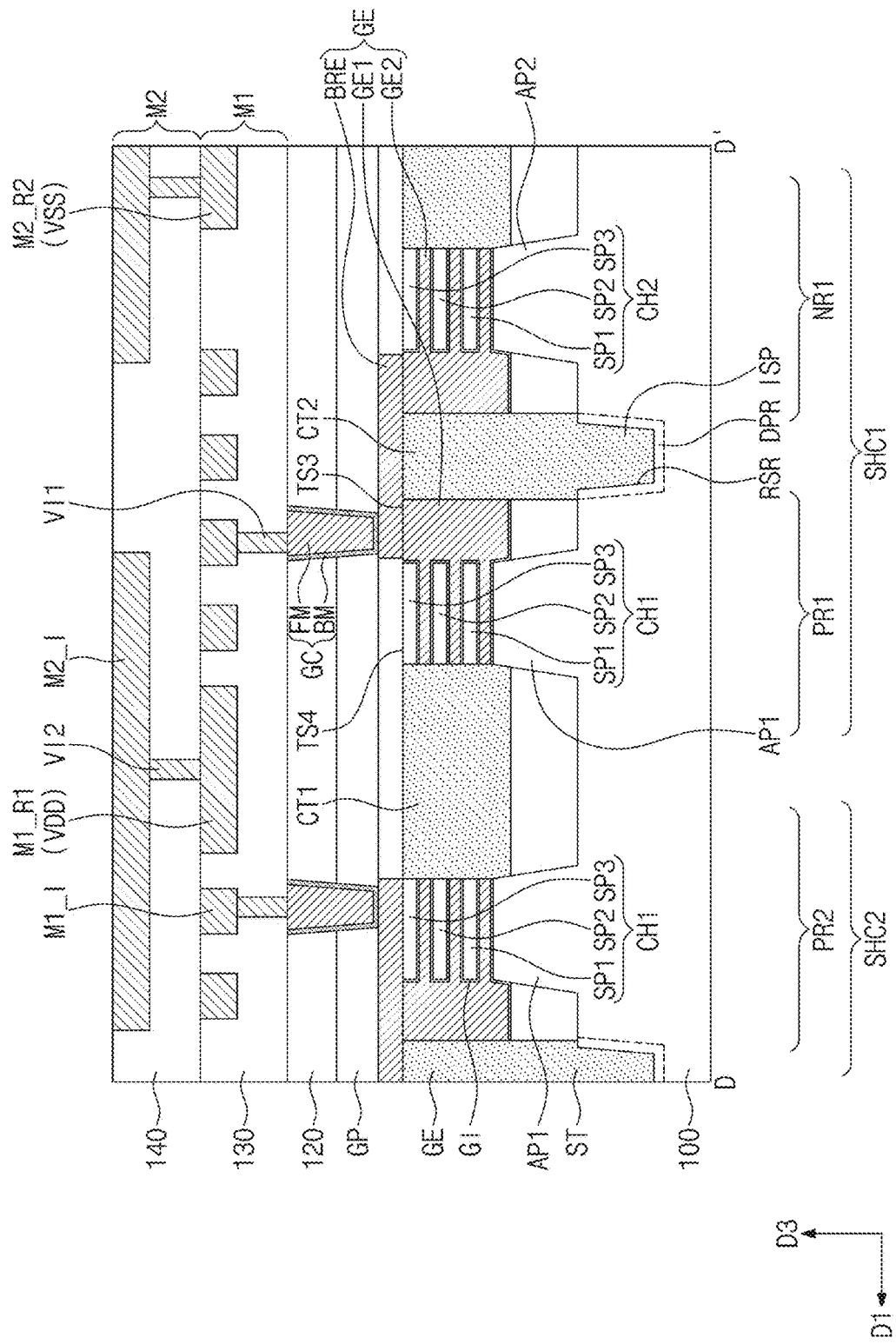

FIGS. 22 and 23 are sectional views, each of which is taken along a line D-D' of FIG. 4 to illustrate a semiconductor device according to an embodiment of inventive concepts. In the following description, an element previously described with reference to FIGS. 4 and 21A to 21D may be identified by the same reference number without repeating an overlapping description thereof.

Referring to FIG. 22, the gate electrode GE on the first single height cell SHC1 may include the first gate electrode GE1 on the first active patterns AP1 and the second gate electrode GE2 on the second active patterns AP2. The gate electrode GE may further include the bridge electrode BRE on the first and second gate electrodes GE1 and GE2.

The first gate cutting pattern CT1 may cover the outermost side surface of each of the first and second channel patterns CH1 and CH2. The second gate cutting pattern CT2 may be provided between the first and second gate electrodes GE1 and GE2. The recess region RSR may be defined between the first PMOSFET and NMOSFET regions PR1 and NR1, and the second gate cutting pattern CT2 may include the isolation pattern ISP filling the recess region RSR. The substrate 100 may include the impurity region DPR around the recess region RSR.

Referring to FIG. 23, each of the first and second gate electrodes GE1 and GE2 may include the third top surface TS3. The third semiconductor pattern SP3 of each of the first and second channel patterns CH1 and CH2 may include the fourth top surface TS4. The third top surface TS3 may be located at a level that is the same as or lower than the fourth top surface TS4.

Figure 24:
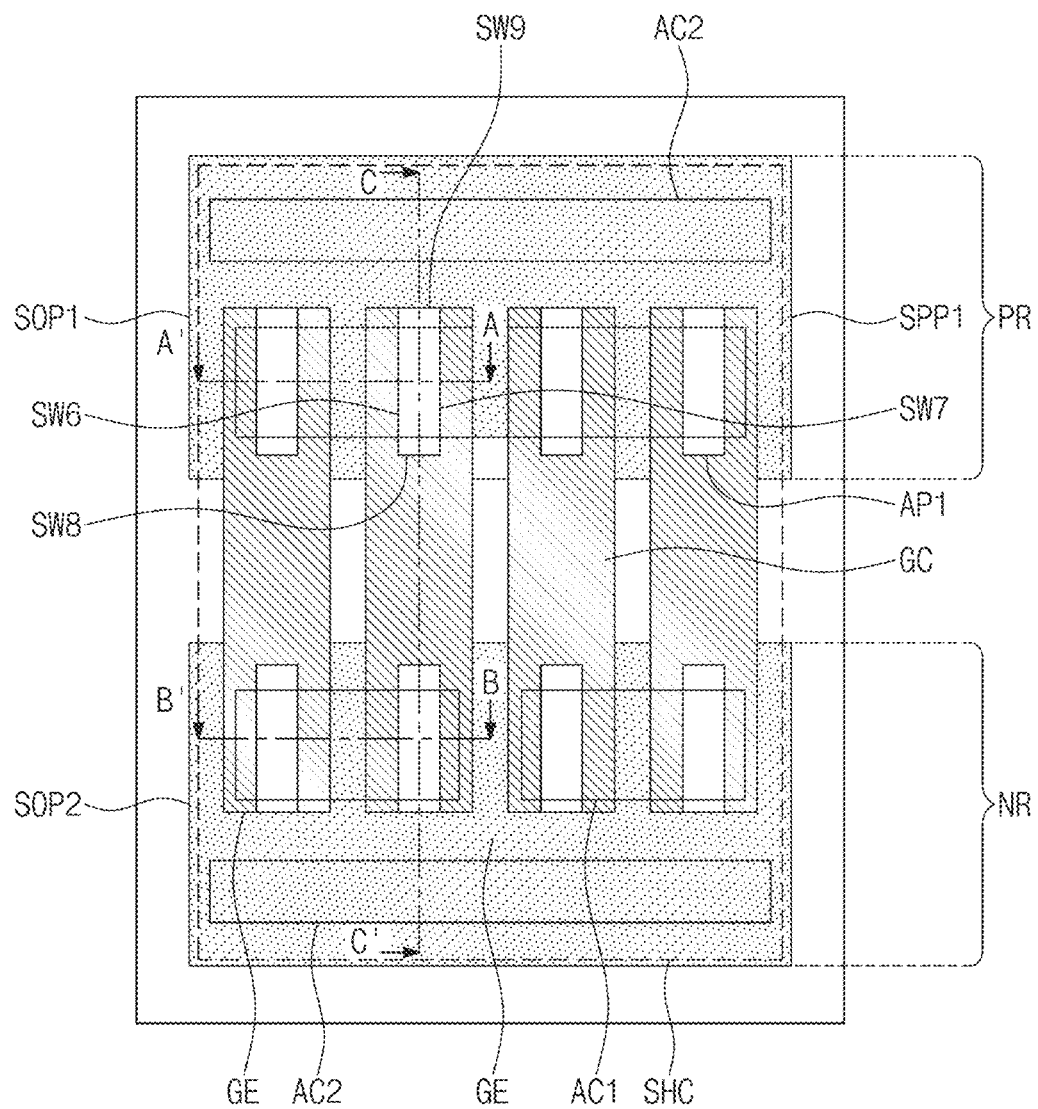
FIG. 24 is a plan view illustrating a semiconductor device according to an embodiment of inventive concepts.
Figure 25A:
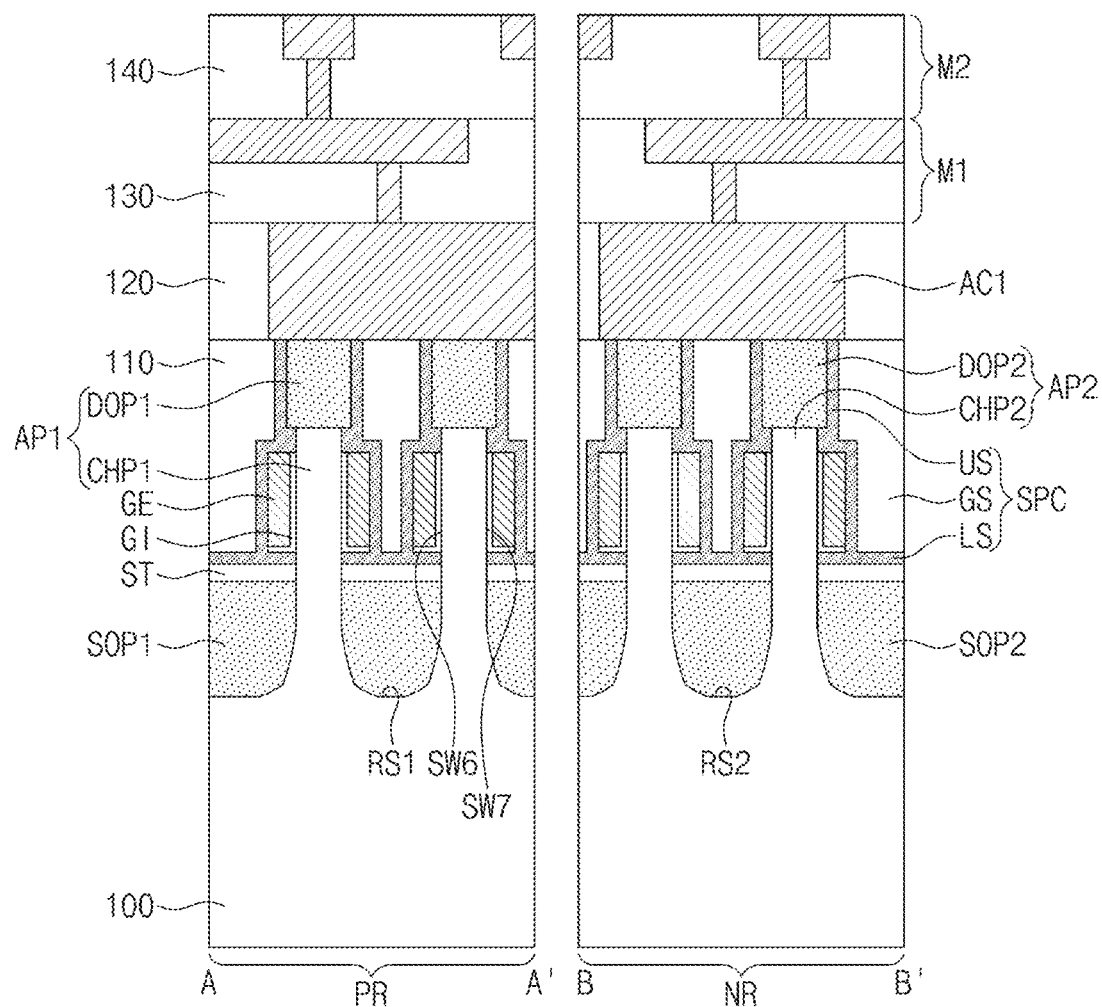
FIG. 25A is a sectional view taken along lines A-A' and B-B' of FIG. 24.
Figure 25B:
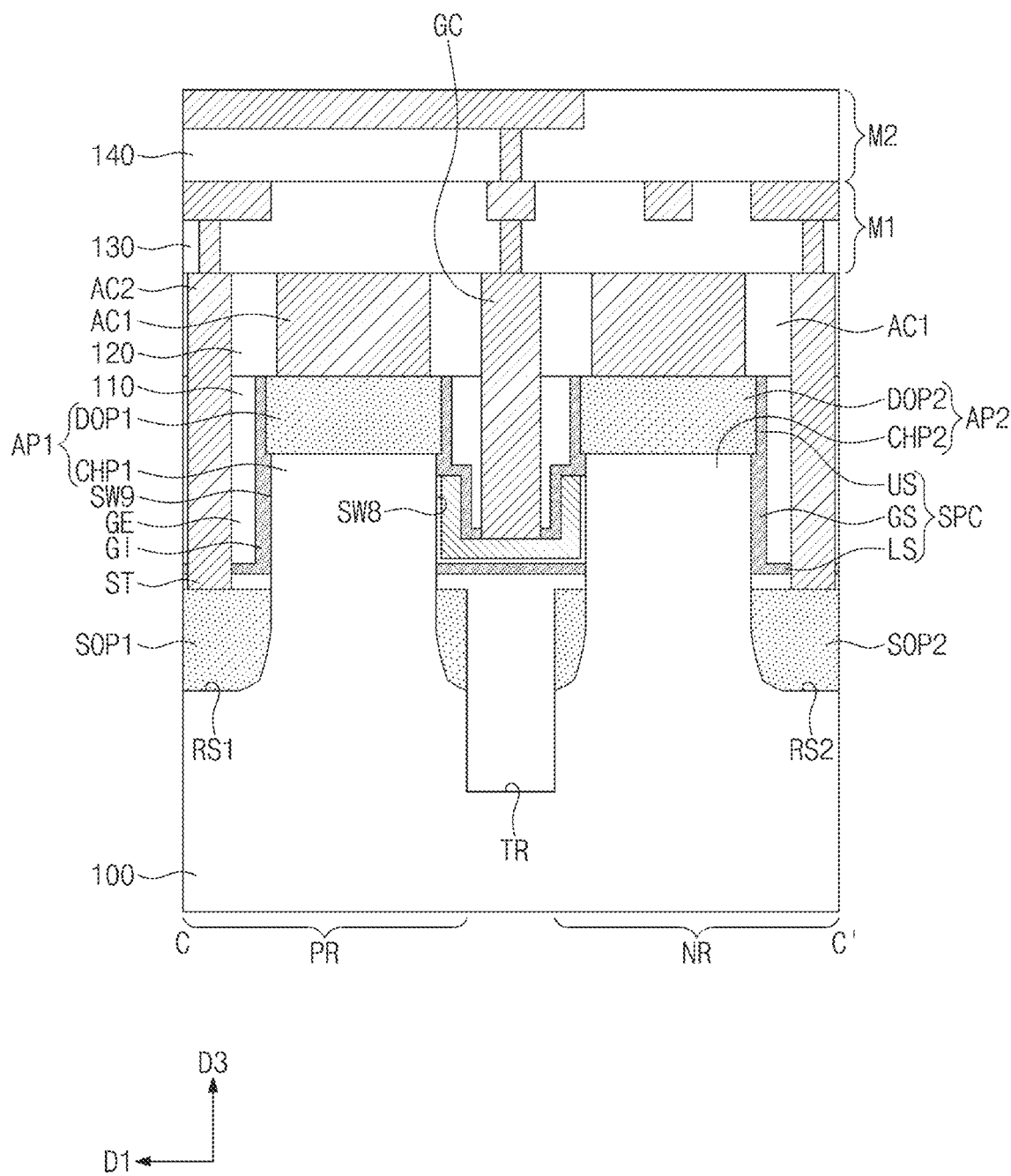
FIG. 25B is a sectional view taken along a line C-C' of FIG. 24.

FIG. 24 is a plan view illustrating a semiconductor device according to an embodiment of inventive concepts. FIG. 25A is a sectional view taken along lines A-A' and B-B' of FIG. 24. FIG. 25B is a sectional view taken along a line C-C' of FIG. 24.

Referring to FIGS. 24, 25A, and 25B, the single height cell SHC may be provided on the substrate 100. The single height cell SHC may be a logic cell including a logic device (e.g., inverter, flip-flop, and so forth) which is configured to execute a specific function. The single height cell SHC may include vertical-type transistors, which constitute the logic device, and interconnection lines, which connect the vertical-type transistors to each other.

The single height cell SHC on the substrate 100 may include a first active region PR and a second active region NR. For example, the first active region PR may be a PMOSFET region, and the second active region NR may be an NMOSFET region. The first and second active regions PR and NR may be defined by a trench TR, which is formed in an upper portion of the substrate 100. The first and second active regions PR and NR may be spaced apart from each other in the first direction D1.

A first lower epitaxial pattern SOP1 may be provided on the first active region PR, and a second lower epitaxial pattern SOP2 may be provided on the second active region NR. When viewed in a plan view, the first lower epitaxial pattern SOP1 may be overlapped with the first active region PR, and the second lower epitaxial pattern SOP2 may be overlapped with the second active region NR. The first and second lower epitaxial patterns SOP1 and SOP2 may be epitaxial patterns that are formed by a selective epitaxial growth process. The first lower epitaxial pattern SOP1 may be provided in a first recess region RS1 of the substrate 100, and the second lower epitaxial pattern SOP2 may be provided in a second recess region RS2 of the substrate 100.

The first active patterns AP1 may be provided on the first active region PR, and the second active patterns AP2 may be provided on the second active region NR. Each of the first and second active patterns AP1 and AP2 may be a vertically-protruding fin pattern. When viewed in a plan view, each of the first and second active patterns AP1 and AP2 may be a bar-shaped pattern extending in the first direction D1. The first active patterns AP1 may be arranged in the second direction D2, and the second active patterns AP2 may be arranged in the second direction D2.

Each of the first active patterns AP1 may include a first channel pattern CHP1, which vertically protrudes from the first lower epitaxial pattern SOP1, and a first upper epitaxial pattern DOP1, which is provided on the first channel pattern CHP1. Each of the second active patterns AP2 may include a second channel pattern CHP2, which vertically protrudes from the second lower epitaxial pattern SOP2, and a second upper epitaxial pattern DOP2, which is provided on the second channel pattern CHP2.

The device isolation layer ST may be provided on the substrate 100 to fill the trench TR. The device isolation layer ST may cover top surfaces of the first and second lower epitaxial patterns SOP1 and SOP2. The first and second active patterns AP1 and AP2 may protrude vertically above the device isolation layer ST.

The gate electrodes GE may be provided on the device isolation layer ST and may be extended in the first direction D1 to be parallel to each other. The gate electrodes GE may be arranged in the second direction D2. The gate electrode GE may surround the first channel pattern CHP1 of the first active pattern AP1 and may surround the second channel pattern CHP2 of the second active pattern AP2.

For example, the first channel pattern CHP1 of the first active pattern AP1 may have sixth to ninth side surfaces SW6, SW7, SW8, and SW9. The sixth and seventh side surfaces SW6 and SW7 may be opposite to each other in the second direction D2, and the eighth and ninth side surfaces SW8 and SW9 may be opposite to each other in the first direction D1. The gate electrode GE may be provided on the sixth side surface SW6, the seventh side surface SW7, and the eighth side surface SW8. However, the gate electrode GE may not be provided on the ninth side surface SW9, which is the outermost side surface, and may expose the ninth side surface SW9.

The gate insulating layer GI may be interposed between the gate electrode GE and each of the first and second channel patterns CHP1 and CHP2. The gate insulating layer GI may cover bottom and inner side surfaces of the gate electrode GE. For example, the gate insulating layer GI may directly cover the sixth side surface SW6, the seventh side surface SW7, and the eighth side surface SW8 of the first active pattern AP1. The gate insulating layer GI may not cover the ninth side surface SW9.

The first and second upper epitaxial patterns DOP1 and DOP2 may protrude vertically above the gate electrode GE. The top surface of the gate electrode GE may be lower than the bottom surface of each of the first and second upper epitaxial patterns DOP1 and DOP2. In other words, each of the first and second active patterns AP1 and AP2 may have a structure, which protrudes vertically from the substrate 100 and penetrate the gate electrode GE.

The semiconductor device according to the present embodiment may include vertical-type transistors, in which carriers move in the third direction D3. For example, in the case where the transistor is turned on by applying a voltage to the gate electrode GE, carriers may move from the lower epitaxial pattern SOP1 or SOP2 to the upper epitaxial pattern DOP1 or DOP2 through the channel pattern CHP1 or CHP2. The semiconductor device according to the present embodiment may include a three-dimensional field effect transistor (e.g., VFET), in which the gate electrode GE is provided to surround the side surface of the channel pattern CHP1 or CHP2.

In the present embodiment, since the channel pattern CHP1 or CHP2 has a thin body structure, the semiconductor device according to the present embodiment may behave like the fully-depleted device. Even when, as shown in FIGS. 24 and 25B, the gate electrode GE does not cover the outermost side surface SW9 of the channel pattern CHP1 or CHP2, the device may be normally operated.

A spacer SPC may be provided on the device isolation layer ST to cover the gate electrodes GE and the first and second active patterns AP1 and AP2. The spacer SPC may contain a silicon nitride layer or a silicon oxynitride layer. The spacer SPC may include a lower spacer LS, an upper spacer US, and the gate spacer GS between the lower and upper spacers LS and US. The spacer SPC may cover the exposed surface (e.g., the outermost side surface SW9) of the channel pattern CHP1 or CHP2.

The lower spacer LS may directly cover the top surface of the device isolation layer ST. The gate electrodes GE may be spaced apart from the device isolation layer ST in the third direction D3 by the lower spacer LS. The gate spacer GS may cover the top and outer side surfaces of each of the gate electrodes GE. The upper spacer US may cover the first and second upper epitaxial patterns DOP1 and DOP2. However, the upper spacer US may not cover top surfaces of the first and second upper epitaxial patterns DOP1 and DOP2, and the top surfaces of the first and second upper epitaxial patterns DOP1 and DOP2 may be exposed.

The first interlayer insulating layer 110 may be provided on the spacer SPC. The first interlayer insulating layer 110 may have a top surface that is substantially coplanar with the top surfaces of the first and second upper epitaxial patterns DOP1 and DOP2. The second to fourth interlayer insulating layers 120, 130, and 140 may be sequentially stacked on the first interlayer insulating layer 110. The second interlayer insulating layer 120 may cover the top surfaces of the first and second upper epitaxial patterns DOP1 and DOP2.

At least one first active contact AC1 may be provided to penetrate the second interlayer insulating layer 120 and to be coupled to the first and second upper epitaxial patterns DOP1 and DOP2. At least one second active contact AC2 may be provided to sequentially penetrate the second interlayer insulating layer 120, the first interlayer insulating layer 110, the lower spacer LS, and the device isolation layer ST and to be coupled to the first and second lower epitaxial patterns SOP1 and SOP2. The gate contact GC may be provided to sequentially penetrate the second interlayer insulating layer 120, the first interlayer insulating layer 110, and the gate spacer GS and to be coupled to the gate electrode GE.

The first metal layer M1 may be provided in the third interlayer insulating layer 130. The second metal layer M2 may be provided in the fourth interlayer insulating layer 140. The first and second metal layers M1 and M2 may be configured to have substantially the same features as those in the embodiments previously described with reference to FIGS. 4 and 5A to 5D.

In a semiconductor device according to an embodiment of inventive concepts, a gate electrode on a logic cell may be provided to have a reduced length, and this may make it possible to reduce a cell height of the logic cell. Accordingly, it may be possible to reduce an area of a chip, in which the logic cells are two-dimensionally disposed, and thereby to increase an integration density of the semiconductor device. In addition, by dividing a gate electrode and reducing its size, it may be possible to reduce a parasitic capacitance, which is produced near the gate electrode. As a result, electric characteristics of the semiconductor device may be also be improved.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a first active pattern and a second active pattern;
   a first channel pattern on the first active pattern, the first channel pattern including a plurality of first semiconductor patterns that are stacked and vertically spaced apart from each other;
   a second channel pattern on the second active pattern, the second channel pattern including a plurality of second semiconductor patterns that are stacked and vertically spaced apart from each other;
   a gate electrode on the first channel pattern and the second channel pattern; and
   a first gate cutting pattern and a second gate cutting pattern that are disposed at both ends of the gate electrode, respectively,
   wherein the first gate cutting pattern covers a first outermost side surface of the plurality of first semiconductor patterns, and
   the second gate cutting pattern covers a second outermost side surface of the plurality of second semiconductor patterns.

2. The semiconductor device of claim 1, wherein
   the first outermost side surface is an outermost one among side surfaces of the plurality of first semiconductor patterns, and
   the second outermost side surface is an outermost one among side surfaces of the plurality of second semiconductor patterns.

3. The semiconductor device of claim 1, wherein
   the both ends of the gate electrode includes a first end and a second end,
   the first end of the gate electrode contacts the first gate cutting pattern,
   the second end of the gate electrode contacts the second gate cutting pattern,
   the gate electrode has a gate length from the first end of the gate electrode to the second end of the gate electrode, and
   the gate length is proportional to a cell height of a logic cell.

4. The semiconductor device of claim 1, further comprising:
   a gate contact electrically connected to the gate electrode; and
   a first metal layer on the gate contact, the first metal layer including a first power line and a second power line,
   wherein the first gate cutting pattern and the second gate cutting pattern are below the first power line and the second power line, respectively.

5. The semiconductor device of claim 1, wherein
   the gate electrode comprises a first gate electrode on the first channel pattern and a second gate electrode on the second channel pattern, and
   a length of the first gate electrode is different from a length of the second gate electrode.

6. The semiconductor device of claim 5, further comprising a third gate cutting pattern between the first gate electrode and the second gate electrode,
   wherein the third gate cutting pattern comprises an isolation pattern filling a recess region between the first active pattern and the second active pattern.

7. The semiconductor device of claim 6, wherein
   the substrate further includes an impurity region between the first active pattern and the second active pattern,
   the impurity region is below the third gate cutting pattern.

8. The semiconductor device of claim 7, wherein the impurity region is configured to electrically disconnect the first active pattern and the second active pattern from each other.

9. The semiconductor device of claim 5, wherein
   the gate electrode further comprises a bridge electrode, the bridge electrode is on the first gate electrode and the second gate electrode to connect the first gate electrode and the second gate electrode to each other.

10. The semiconductor device of claim 1, wherein
the gate electrode surrounds each of the plurality of first semiconductor patterns, and
the gate electrode surrounds each of the plurality of second semiconductor patterns.

11. A semiconductor device, comprising:
a substrate including a first logic cell and a second logic cell, which are adjacent to each other;
a first active pattern on the first logic cell;
a first channel pattern on the first active pattern, the first channel pattern including a plurality of first semiconductor patterns that are stacked and vertically spaced apart from each other;
a second active pattern on the second logic cell;
a second channel pattern on the second active pattern, the second channel pattern including a plurality of second semiconductor patterns that are stacked and vertically spaced apart from each other;
a first gate electrode on the first channel pattern;
a second gate electrode on the second channel pattern; and
a gate cutting pattern on a border between the first logic cell and the second logic cell, the gate cutting pattern being between the first gate electrode and the second gate electrode,
wherein the gate cutting pattern covers a first outermost side surface of the plurality of first semiconductor patterns and a second outermost side surface of the plurality of second semiconductor patterns.

12. The semiconductor device of claim 11, wherein
the first outermost side surface is an outermost one among side surfaces of the plurality of first semiconductor patterns, and
the second outermost side surface is an outermost one among side surfaces of the plurality of second semiconductor patterns.

13. The semiconductor device of claim 11, further comprising:
a gate contact electrically connected to at least one of the first and second gate electrodes; and
metal layers stacked on the gate contact.

14. The semiconductor device of claim 11, wherein
the first gate electrode surrounds each of the plurality of first semiconductor patterns, and
the second gate electrode surrounds each of the plurality of second semiconductor patterns.

15. The semiconductor device of claim 11, further comprising a device isolation layer on the substrate,
wherein the device isolation layer is between the first and second active patterns and below the gate cutting pattern.

16. A semiconductor device, comprising:
a substrate including a logic cell, the logic cell comprising a PMOSFET region and an NMOSFET region that are spaced apart from each other in a first direction,
the logic cell having a first border, a second border, a third border, and fourth border, the first border and the second border being opposite to each other in a second direction crossing the first direction, the third border and the fourth border being opposite to each other in the first direction;
a device isolation layer on the substrate, the device isolation layer defining a first active pattern on the PMOSFET region and a second active pattern on the NMOSFET region;
a first channel pattern on the first active pattern, the first channel pattern including a plurality of first semiconductor patterns that are stacked and vertically spaced apart from each other;
a second channel pattern on the second active pattern, the second channel pattern including a plurality of second semiconductor patterns that are stacked and vertically spaced apart from each other;
a gate electrode on the first channel pattern and the second channel pattern, the gate electrode extending in the first direction;
a division structure on at least one of the first border and the second border;
a first gate cutting pattern and a second gate cutting pattern, which are respectively on the third border and the fourth border, a first end of the gate electrode being in contact with the first gate cutting pattern, a second end of the gate electrode being in contact with the second gate cutting pattern;
each of the first channel pattern and the second channel pattern includes a first side surface and a second side surface, which are opposite to each other,
the first gate cutting pattern covers the second side surface of the first channel pattern,
the second gate cutting pattern covers the second side surface of the second channel pattern, and
the gate electrode is on the first side surface of the first channel pattern and the first side surface of the second channel pattern.

17. The semiconductor device of claim 16, wherein
each of the first and second semiconductor patterns includes a top surface, a bottom surface, a first side surface, and a second side surface opposite the first side surface,
the first side surfaces of the plurality of first semiconductor patterns constitute the first side surface of the first channel pattern,
the second side surfaces of the plurality of first semiconductor patterns constitute the second side surface of the first channel pattern,
the first side surfaces of the plurality of second semiconductor patterns constitute the first side surface of the second channel pattern, and
the second side surfaces of the plurality of second semiconductor patterns constitute the second side surface of the second channel pattern.

18. The semiconductor device of claim 16, further comprising:
a gate contact electrically connected to the gate electrode; and
a first metal layer on the gate contact,
wherein the first metal layer includes a first power line and a second power line that are respectively on the third border and the fourth border.

19. The semiconductor device of claim 16, wherein
the gate electrode comprises a first gate electrode on the first channel pattern and a second gate electrode on the second channel pattern, and
a length of the first gate electrode is different from a length of the second gate electrode.

20. The semiconductor device of claim 19, further comprising a third gate cutting pattern between the first gate electrode and the second gate electrode,
wherein the third gate cutting pattern comprises an isolation pattern filling a recess region between the first active pattern and the second active pattern.

* * * * *